US010026353B2

(12) United States Patent
Tamura

(10) Patent No.: US 10,026,353 B2
(45) Date of Patent: Jul. 17, 2018

(54) IMAGE DISPLAY DEVICE HAVING VOLTAGE SELECTION CIRCUIT

(71) Applicant: SEIKO EPSON CORPORATION, Tokyo (JP)

(72) Inventor: Tsuyoshi Tamura, Hara-mura (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/340,818

(22) Filed: Nov. 1, 2016

(65) Prior Publication Data

US 2017/0169755 A1 Jun. 15, 2017

(30) Foreign Application Priority Data

Dec. 15, 2015 (JP) .................. 2015-244309

(51) Int. Cl.
*G09G 3/36* (2006.01)
*G09G 3/20* (2006.01)
*G11C 7/06* (2006.01)
*G09G 3/00* (2006.01)

(52) U.S. Cl.
CPC .......... *G09G 3/2092* (2013.01); *G09G 3/003* (2013.01); *G09G 3/3648* (2013.01); *G09G 3/3688* (2013.01); *G09G 3/3696* (2013.01); *G11C 7/06* (2013.01); *G09G 3/001* (2013.01); *G09G 2310/027* (2013.01); *G09G 2310/0286* (2013.01); *G09G 2310/0289* (2013.01); *G09G 2310/0291* (2013.01); *G09G 2320/0233* (2013.01); *G09G 2320/0271* (2013.01); *G09G 2330/021* (2013.01); *G09G 2330/027* (2013.01)

(58) Field of Classification Search
CPC ..... G09G 2310/027; G09G 2320/0673; G09G 2320/0276
See application file for complete search history.

(56) References Cited

U.S. PATENT DOCUMENTS

2006/0238473 A1* 10/2006 Hashimoto .......... G09G 3/3688
345/89
2008/0088616 A1  4/2008 Inokuchi
2009/0002358 A1  1/2009 Tamura
(Continued)

FOREIGN PATENT DOCUMENTS

JP  2009-009018 A  1/2009
JP  2013-160872 A  8/2013
(Continued)

*Primary Examiner* — Sanghyuk Park
(74) *Attorney, Agent, or Firm* — Oliff PLC

(57) ABSTRACT

An electro-optic device includes a voltage selection circuit configured to select a higher electric potential side voltage and a lower electric potential side voltage that correspond to upper bits of data, a first output circuit configured to output a first output voltage corresponding to lower bits of data to a data line, a second output circuit having a driving capability higher than that of the first output circuit and configured to output a second output voltage corresponding to upper bits of data among the lower bits of data to the data line, and a control circuit configured to allow the first output circuit and the second output circuit to be driven during a first period, and configured to bring an output of the second output circuit into an OFF state or an almost OFF state during a second period.

9 Claims, 15 Drawing Sheets

(56) References Cited

U.S. PATENT DOCUMENTS

| | | | |
|---|---|---|---|
| 2012/0162274 A1* | 6/2012 | Cho | G09G 3/3688 |
| | | | 345/690 |
| 2012/0206506 A1* | 8/2012 | Kim | G09G 3/20 |
| | | | 345/690 |
| 2014/0285411 A1 | 9/2014 | Tamura et al. | |
| 2015/0049073 A1 | 2/2015 | Morita | |

FOREIGN PATENT DOCUMENTS

| | | |
|---|---|---|
| JP | 2013-190513 A | 9/2013 |
| JP | 2014-186084 A | 10/2014 |
| JP | 2014-186125 A | 10/2014 |
| JP | 2015-036757 A | 2/2015 |
| JP | 2015-114399 A | 6/2015 |
| WO | 2006/030666 A1 | 3/2006 |

* cited by examiner

IMAGE DISPLAY DEVICE HAVING VOLTAGE SELECTION CIRCUIT

BACKGROUND

1. Technical Field

The present invention relates to an electro-optic device, a method for driving an electro-optic device, an electronics device, and the like.

2. Related Art

Heretofore, among display control circuits for electro-optic devices such as an organic EL device, there has been a display control circuit including a first output circuit having a high driving performance and including a dead zone and a second output circuit being capable of outputting a voltage with high accuracy and including no dead zone (for example, JP-A-2013-160872). When such a display control circuit drives an electro-optic device using a grayscale voltage having been selected from among a plurality of grayscale voltages on the basis of a set of display data, the display control circuit allows the first output circuit to drive an output terminal until the voltage level of the output terminal has reached a voltage near a grayscale voltage to be output. Thus, the display control circuit is capable of charging/discharging the output terminal at high speed. Further, when the voltage level of the output terminal has reached the voltage near the grayscale voltage to be output, the output of the first output circuit is brought into a high impedance state because the first output circuit enters its dead zone. At this time point, the output terminal has been charged/discharged up to the voltage near the grayscale voltage by the first output circuit, and thereafter, the output terminal is driven by the second output circuit. Thus, the second output circuit is simply required to be capable of charging/discharging a slight voltage remained to reach the target grayscale voltage. In this case, the second output circuit is capable of outputting a voltage with high accuracy, and thus, the required grayscale voltage is output with high accuracy. As described above, the output terminal is driven in a short time by the high-driving performance first output circuit up to the voltage near the target grayscale voltage, and thereafter, the output terminal is driven by the highly accurate second output circuit. Thus, this configuration not only enables the required grayscale voltage to be output with high accuracy, but also enables reduction of the power consumption.

To date, however, in a display driving operation using a plurality of output circuits each constituted by the high-driving performance first output circuit including a dead zone and the highly accurate second output circuit including no dead zone, a situation in which brightness differences appear among units of display each driven by a corresponding one of the output circuits and these brightness differences degrade the quality of display has sometimes occurred. The highly accurate second output circuit is constituted by transistors each having a large area, that is, having a long transistor-length, to reduce the variation of its output voltage. In contrast, the high-driving performance first output circuit is constituted by transistors each having a short transistor-length because, for this high-driving performance first output circuit, the increase of the operation speed is given more importance than the reduction of the variation. For this reason, the width of the dead zone of the first output circuit varies, and this variation causes the output voltages of the output circuits to differ from one another. Consequently, these differences among the output voltages have appeared as the brightness differences.

SUMMARY

An advantage of some aspects of the invention is that a method for driving an electro-optic device, an electro-optic device, and an electronics device are provided that do not degrade the quality of display even when display driving is performed using a plurality of output circuits each including a high-driving performance first output circuit including a dead zone and a highly accurate second output circuit including no dead zone.

According to a first aspect of the invention, an electro-optic device includes a voltage selection circuit, a first output circuit, a second output circuit, and a control circuit. The voltage selection circuit selects a higher electric potential side voltage and a lower electric potential side voltage that correspond to upper bits of data constituting a set of grayscale level data from among a plurality of reference voltages. The first output circuit outputs a first output voltage corresponding to lower bits of data constituting the set of grayscale level data to a data line on the basis of the higher electric potential side voltage and the lower electric potential side voltage. The second output circuit has a driving capability higher than that of the first output circuit, and outputs a second output voltage corresponding to upper bits of data among the lower bits of data constituting the set of grayscale level data to the data line on the basis of the higher electric potential side voltage and the lower electric potential side voltage. The control circuit allows the first output circuit and the second output circuit to be driven during a first period. Further, the control circuit brings the output of the second output circuit into an OFF state or an almost OFF state and allows the first output circuit to be driven during a second period subsequent to the first period.

In the above first aspect of the invention, a higher electric potential side voltage and a lower electric potential side voltage that correspond to upper bits of data constituting a set of grayscale level data are selected from among a plurality of reference voltages. Further, during a first period, a voltage corresponding to upper bits of data among lower bits of data constituting the set of grayscale level data is output by a second output circuit having a driving capability higher than that of a first output circuit on the basis of the higher electric potential side voltage and the lower electric potential side voltage. Next, in a second period subsequent to the first period, the second output circuit is halted, and a voltage corresponding to the lower bits of data constituting the set of grayscale level data is output by the first output circuit on the basis of the higher electric potential side voltage and the lower electric potential side voltage. In this way, during the second period, during which the voltage corresponding to the lower bits of data constituting the set of grayscale level data is output by the first output circuit, the output of the second output circuit is brought into an OFF state or an almost OFF state, and thus, the output of the first output circuit is not affected by the variation of the output of the second output circuit and the voltage, corresponding to the lower bits of data constituting the set of grayscale level data, is output. As a result, even when a plurality of output circuits each including the first output circuit and the second output circuit are provided and each of the output circuits is used for a corresponding one of a plurality of units of display, the above configuration reduces the variation of the output voltage of each of the units of display, and thus, the occurrence of brightness differences among the units of display is reduced.

In a first optional aspect of the invention, the electro-optic device according to the first aspect of the invention may be configured such that the second output circuit includes a differential pair and an electric current reduction section, and the control circuit allows the electric current reduction section to reduce an electric current flowing through the differential pair during the second period. During the second period, this configuration reduces an electric current flowing through the differential pair of the second output circuit, and thus, the output of the second output circuit does not affect the output of the first output circuit. Moreover, during the second period, the above configuration does not entirely bring the output of the second output circuit into an OFF state, and thus, a rising time of the second output circuit at a next start of the first period is shortened.

In a second optional aspect of the invention, the electro-optic device according to the first aspect or the first optional aspect of the invention may be configured such that the control circuit halts the second output circuit during an interval period after an elapse of the second period until a next start of the first period. According to this second optional aspect, the second output circuit is halted, and thus, the power consumption is reduced.

In a third optional aspect of the invention, the electro-optic device according to the second optional aspect of the invention may be configured such that the control circuit halts the first output circuit during the interval period, after an elapse of the second period until a next start of the first period, in addition to the second output circuit. According to this third optional aspect, during the interval period, the first output circuit is halted in addition to the second output circuit, and thus, the power consumption is further reduced.

According to a second aspect of the invention, an electronics device including the above electro-optic device according to any one of the first aspect and the first to third optional aspects of the invention is provided. According to this second aspect of the invention, an electronics device having high display quality with no unevenness of the brightness is provided.

According to a third aspect of the invention, a method for driving an electro-optic device includes selecting a higher electric potential side voltage and a lower electric potential side voltage that correspond to upper bits of data constituting a set of grayscale level data from among a plurality of reference voltages. A first output voltage corresponding to lower bits of data constituting the set of grayscale level data is output to a data line on the basis of the higher electric potential side voltage and the lower electric potential side voltage. A second output voltage corresponding to upper bits of data among the lower bits of data, constituting the set of grayscale level data, is output to the data line on the basis of the higher electric potential side voltage and the lower electric potential side voltage. Further, the first output voltage and the second output voltage are allowed to be output during a first period, and during a second period subsequent to the first period, the output of the second output circuit is brought into an OFF state or an almost OFF state whereas the first output voltage is allowed to be output.

In the above third aspect of the invention, a higher electric potential side voltage and a lower electric potential side voltage that correspond to upper bits of data constituting a set of grayscale level data are selected from among a plurality of reference voltages. Further, during a first period, a second output voltage corresponding to upper bits of data among lower bits of data constituting the set of grayscale level data is output on the basis of the higher electric potential side voltage and the lower electric potential side voltage. Next, during a second period subsequent to the first period, the output of the second output circuit is brought into an OFF state or an almost OFF state, and a first output voltage corresponding to the lower bits of data constituting the set of grayscale level data is output on the basis of the higher electric potential side voltage and the lower electric potential side voltage. In this way, during the second period, during which the first output voltage corresponding to the lower bits of data constituting the set of grayscale level data is output, the output of the second output circuit is brought into an OFF state or an almost OFF state, and thus, the first output voltage, corresponding to the lower bits of data constituting the set of grayscale level data, is output without affected by the variation of the second output voltage. As a result, even when the first output voltage and the second output voltage are used in a plurality of units of display, the above configuration reduces the variation of the output voltage of each of the units of display, and thus, the occurrence of brightness differences among the units of display is reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described in detail. Here, it should be noted that an embodiment described below does not unduly limit the contents of the invention set forth in appended claims and all of configurations included in the embodiment described below are not essential to the practice of the invention.

1. Driving Circuit

Figure 1:
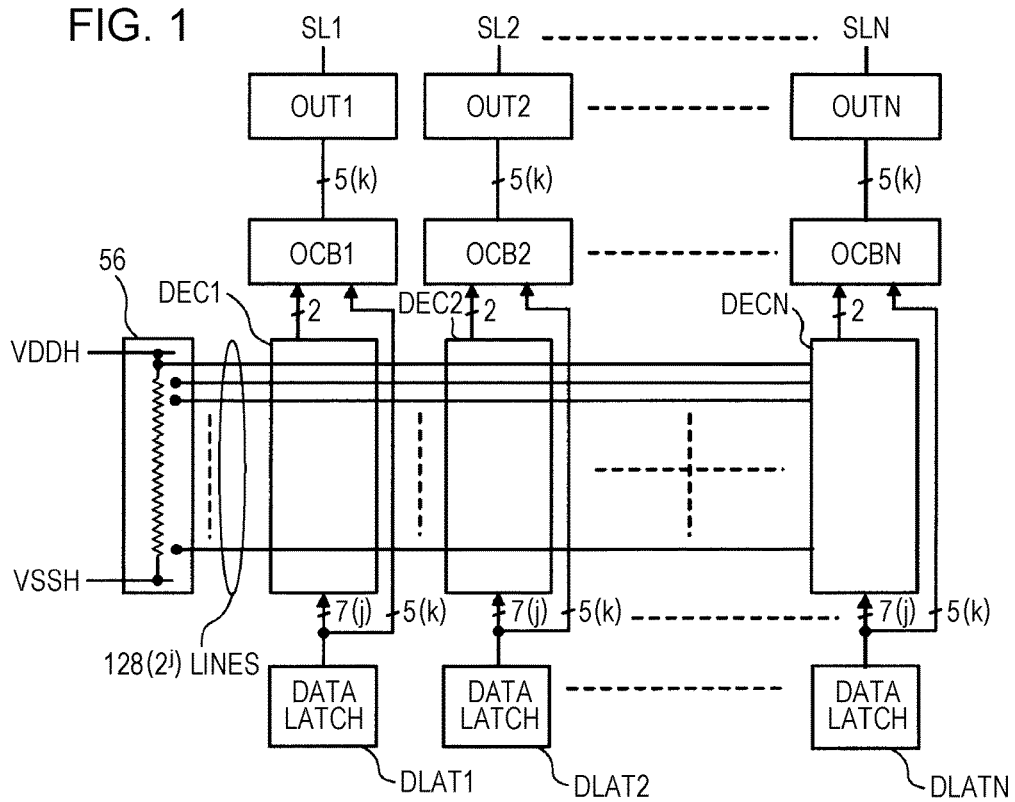
FIG. 1 is a diagram illustrating an example of the configuration of a driving circuit according to an embodiment of the invention.

FIG. 1 illustrates an example of the configuration of a driving circuit according to this embodiment for driving an electro-optic device. The driving circuit shown in FIG. 1 includes a reference voltage generation circuit 56 (a grayscale voltage generation circuit in a narrow sense), data latches DLAT1 to DLATN (N being a natural number larger than or equal to "2"), voltage selection circuits DEC1 to DECN (D/A conversion circuits in a narrow sense), second voltage selection circuits OCB1 to OCBN (second D/A conversion circuits in a narrow sense), and output circuits OUT1 to OUTN.

Here, in the following, a configuration in which each set of grayscale level data is composed of twelve (=(j+k)) bits of data ((j+k) bits of data in a broad sense), seven (j) upper bits of data among the twelve (=(j+k)) bits of data being input to a corresponding one of the voltage selection circuits, five (k) lower bits of data among the twelve (=(j+k)) bits of data being input to a corresponding one of the second voltage selection circuits (j and k being natural numbers) will be taken as an example and described, but this embodiment is not limited to this configuration. Further, in the following, a configuration and an operation corresponding to a data line SL1 will be described, but a configuration and an operation corresponding to each of the other data lines SL2 to SLN are the same as the configuration and the operation corresponding to the data line SL1.

The data latch DLAT1 latches a set of grayscale level data composed of the twelve bits (=(j+k)) of data and corresponding to one pixel. The set of grayscale level data is input from, for example, a line latch 52 shown in FIG. 15.

The reference voltage generation circuit 56 divides a voltage from a higher electric potential side power supply voltage VDDH up to a lower electric potential side power supply voltage VSSH using resistors to output 128 ($=2^j$) kinds of reference voltages (grayscale voltages in a narrow sense). The higher electric potential side power supply voltage VDDH and the lower electric potential side power supply voltage VSSH are supplied from, for example, a power supply circuit 760 shown in FIG. 16.

Upon receipt of the seven (j) upper bits of data, which constitute the set of grayscale level data transferred from the data latch DLAT1, the voltage selection circuit DEC1 selects a lower electric potential side voltage SELA and a higher electric potential side voltage SELB from among the 128 kinds of reference voltages. The lower electric potential side voltage SELA and the higher electric potential side voltage SELB are voltages corresponding to one interval (one increment) of the 128 kinds of reference voltages.

Upon receipt of the five (k) lower bits of data, which constitute the set of grayscale level data transferred from the data latch DLAT1, the second voltage selection circuit OCB1 outputs 1st to 5th selection voltages p1 to p5 (1st to k-th selection voltages p1 to pk). Each of the 1st to 5th selection voltages p1 to p5 is associated with a corresponding one of the five lower bits of data, which constitute the set of grayscale level data. In the case where a bit of data has a first logical value (for example, "0"), the lower electric potential side voltage SELA is selected as a corresponding selection voltage, whereas in the case where the bit of data has a second logical value (for example, "1"), the higher electric potential side voltage SELB is selected as a corresponding selection voltage.

The output circuit OUT1 outputs a voltage corresponding to the set of grayscale level data among voltages resulting from dividing a voltage from the lower electric potential side voltage SELA up to the higher electric potential side voltage SELB by "32 ($2^k$)" to the data line SL1 on the basis of the 1st to 5th selection voltages p1 to p5. In this way, output voltages each associated with a corresponding one of 4096 (=128×32) ($2^{(j+k)}$) grayscale levels are obtained.

2. Output Circuit

Figure 2:
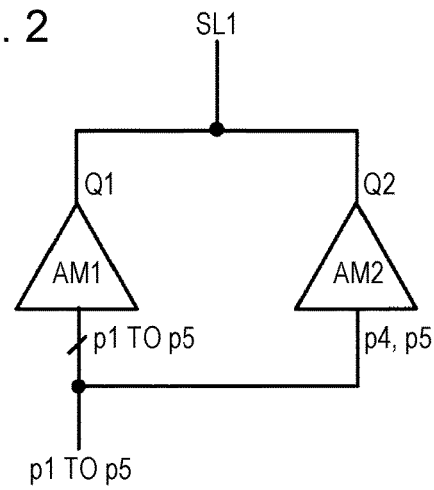
FIG. 2 is a diagram illustrating an example of the configuration of an output circuit included in the driving circuit.

FIG. 2 illustrates an example of the configuration of the output circuit OUT1. The output circuit OUT1 shown in FIG. 2 includes a first output circuit AM1 and a second output circuit AM2. In the following, a configuration and an operation corresponding to the data line SL1 will be described, but a configuration and an operation corresponding to each of the other data lines SL2 to SLN are the same as the configuration and the operation corresponding to the data line SL1.

Upon receipt of the 1st to 5th selection voltages p1 to p5 (the 1st to k-th selection voltages), the first output circuit AM1 outputs one of the voltages resulting from dividing a voltage from the lower electric-potential voltage SELA up to the higher electric-potential voltage SELB by "32 ($2^k$)" as a first output voltage Q1. An example of the detailed configuration of the first output circuit AM1 will be described using FIG. 9.

The second output circuit AM2 has a driving capability (for example, a slew rate) higher than that of the first output circuit AM1, and upon receipt of 4th and 5th selection voltages p4 and p5 each associated with a corresponding one of upper bits of data D4 and D5 among the five (k) lower bits of data D1 to D5, the second output circuit AM2 outputs one of four kinds of voltages falling within a range from the lower electric potential side voltage SELA up to the higher electric potential side voltage SELB as a second output voltage Q2. The second output circuit AM2 includes a dead zone, and in this embodiment, at a timing point when its output voltage has reached the dead zone, or any other specific timing point, the output of the second output circuit AM2 is controlled so as to be brought into an OFF state. The detailed configuration of the second output circuit AM2 will be described using FIG. 10.

Figure 3:
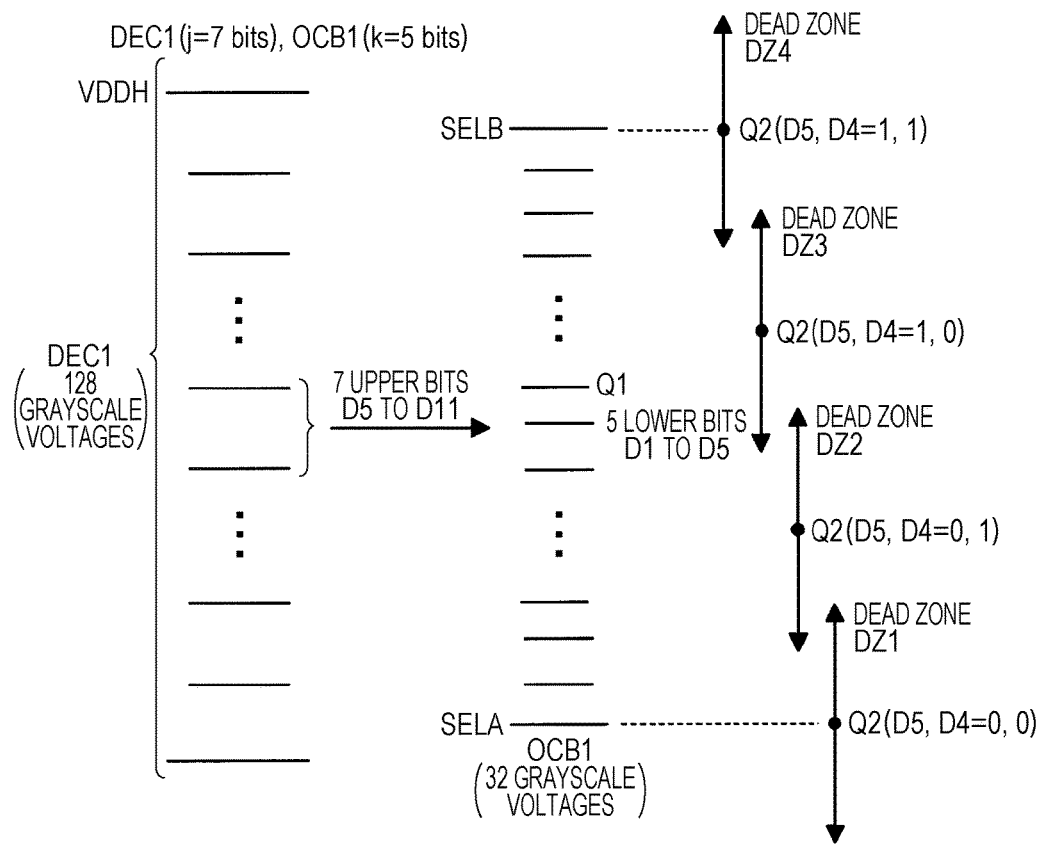
FIG. 3 is a diagram illustrating the operation of the driving circuit.

FIG. 3 illustrates a diagram illustrating the operation of the driving circuit, which is illustrated in FIG. 1 and includes the output circuit OUT1. In the following, the configuration, which is shown in FIG. 1 and in which j=seven bits and k=five bits, will be taken as an example and described.

As shown in FIG. 3, the voltage selection circuit DEC1 selects the two reference voltages SELA and SELB from among the 128 kinds of reference voltages, which correspond to seven (j) upper bits of data D6 to D12 among pieces of grayscale level data D1 to D12 constituting the set of grayscale level data. The second voltage selection circuit OCB1 selects, for each of the 1st to 5th selection voltages p1 to p5, which is associated with a corresponding one of five (k) lower bits of data D1 to D5 among the pieces of grayscale level data D1 to D12, either the reference voltage SELA or the reference voltage SELB.

In the case where the upper bits of data (D5, D4)=(L, L), that is, the selection voltages (p5, p4)=(SELA, SELA), the second output circuit AM2 outputs the second output voltage Q2 such that Q2=SELA, and includes a dead zone DZ1 whose center is located at this Q2. In the case where the upper bits of data (D5, D4)=(L, H), that is, the selection voltages (p5, p4)=(SELA, SELB), the second output circuit AM2 outputs the second output voltage such that Q2=SELA+(1/3)×(SELB−SELA), and includes a dead zone DZ2 whose center is located at this Q2. In the case where the upper bits of data (D5, D4)=(H, L), that is, the selection voltages (p5, p4)=(SELB, SELA), the second output circuit AM2 outputs the second output voltage Q2 such that Q2=SELA+(2/3)×(SELB−SELA), and includes a dead zone DZ3 whose center is located this Q2. In the case where the upper bits of data (D5, D4)=(H, H), that is, the selection voltages (p5, p4)=(SELB, SELB), the second output circuit AM2 outputs the second output voltage Q2 such that Q2=SELB, and includes a dead zone DZ4 whose center is located at this Q2.

The first output circuit AM1 outputs the output voltage Q1, that is, a voltage corresponding to the five lower bits of data D1 to D5 among the pieces of grayscale level data D1 to D12 and selected from among voltages resulting from dividing a voltage from the lower electric potential side voltage SELA up to the higher electric potential side voltage SELB by "32".

Figure 4:
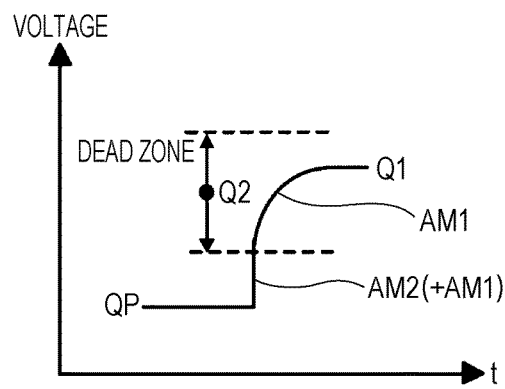
FIG. 4 is a diagram schematically illustrating the temporal variation of a voltage output by the output circuit.

FIG. 4 schematically illustrates a temporal change of a voltage output by the output circuit OUT1. As shown in FIG. 4, it is assumed that the output circuit OUT1 has output a voltage QP in its previous driving operation. When the parasitic capacitance and the pixel capacitance of the data line SL1 are charged from the voltage QP up to a voltage Q1, the second output circuit AM2 and the first output circuit AM1 drive the data line SL1 during a period (a first period) from a timing point when the charged voltage has reached the voltage QP until a timing point when the charged voltage has reached the lower end (or the upper end) of a dead zone, and the first output circuit AM1 drives the data line SL1 during a period (a second period) from the timing point when the charged voltage has reached the lower end of the dead zone until a timing point when the charged voltage has reached the voltage Q1. During the period when the first output circuit AM1 drives the data line, the output of the second output circuit AM2 is in an OFF state, the voltage Q1 is not affected by the variation of the dead zone of the second output circuit AM2.

Figure 5:
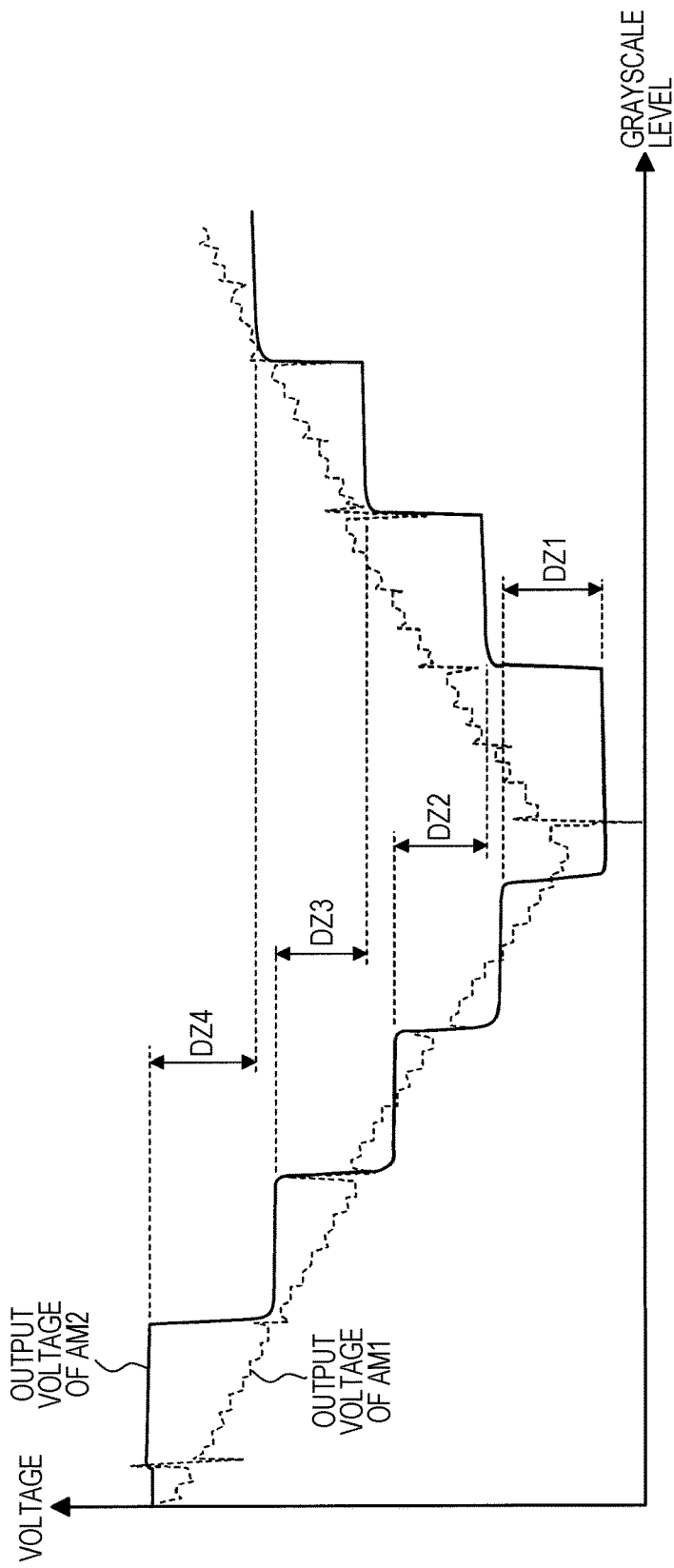
FIG. 5 is a diagram illustrating the characteristics of the output voltages of a first output circuit and a second output circuit that are included in the output circuit in the case where grayscale levels are changed one by one.

FIG. 5 illustrates the output voltage characteristics of the first output circuit AM1 and the second output circuit AM2 in the case where grayscale levels (corresponding to the horizontal axis) are changed one by one.

As shown in FIG. 5, in the case where the grayscale levels are decreased, the output voltage of the second output circuit AM2 is changed from the upper end of the dead zone DZ 4 to the upper end of the dead zone DZ 3 and further from the upper end of the dead zone DZ 3 to the upper end of the dead zone DZ 2 along with the change of the upper bits of data (D5, D4); whereas in the case where the grayscale levels are increased, the output voltage of the second output circuit AM2 is changed from the lower end of the dead zone DZ 1 to the lower end of the dead zone DZ 2 and further from the lower end of the dead zone DZ 2 to the lower end of the dead zone DZ 3 along with the change of the upper bits of data (D5, D4). Here, it should not be noted that, although, in FIG. 3, an example in which the upper end of one dead zone and the lower end of another dead zone adjacent to the one dead zone (for example, the upper end of the dead zone DZ1 and the lower end of the dead zone DZ2) overlap with each other has been described, the upper end of the one dead zone and the lower end of the another dead zone adjacent to the one dead zone do not necessarily overlap with each other (or are not necessarily in contact with each other) in this embodiment, as shown in FIG. 5. This is because the driving capability of the second output circuit AM2 becomes sufficiently smaller than that of the first output circuit AM1 at a point near the end of a dead zone, and thus, the first output circuit AM1 is capable of outputting its grayscale voltage even at a point not within the dead zone.

With the above configuration, the second output circuit AM2 sequentially shifts each of the dead zones on the basis of the 4th and 5th selection voltages p4 and p5, and thus, a voltage range in which the grayscale voltage is not output is eliminated. Further, with the above configuration, the number of bits handled in the voltage selection circuit DEC1 is made small without expanding the width of each of the dead zones, and thus, the layout area of the voltage selection circuit DEC1 is reduced while still keeping high-speed driving operation.

Further, in this embodiment, at least two selected signals (p4 and p5) are simply required to be input to the second output circuit AM2. That is, more selected signals may be input to the second output circuit AM2 to allow dead zones to be shifted at further multiple stages.

3. Voltage Selection Circuit

Figure 6:
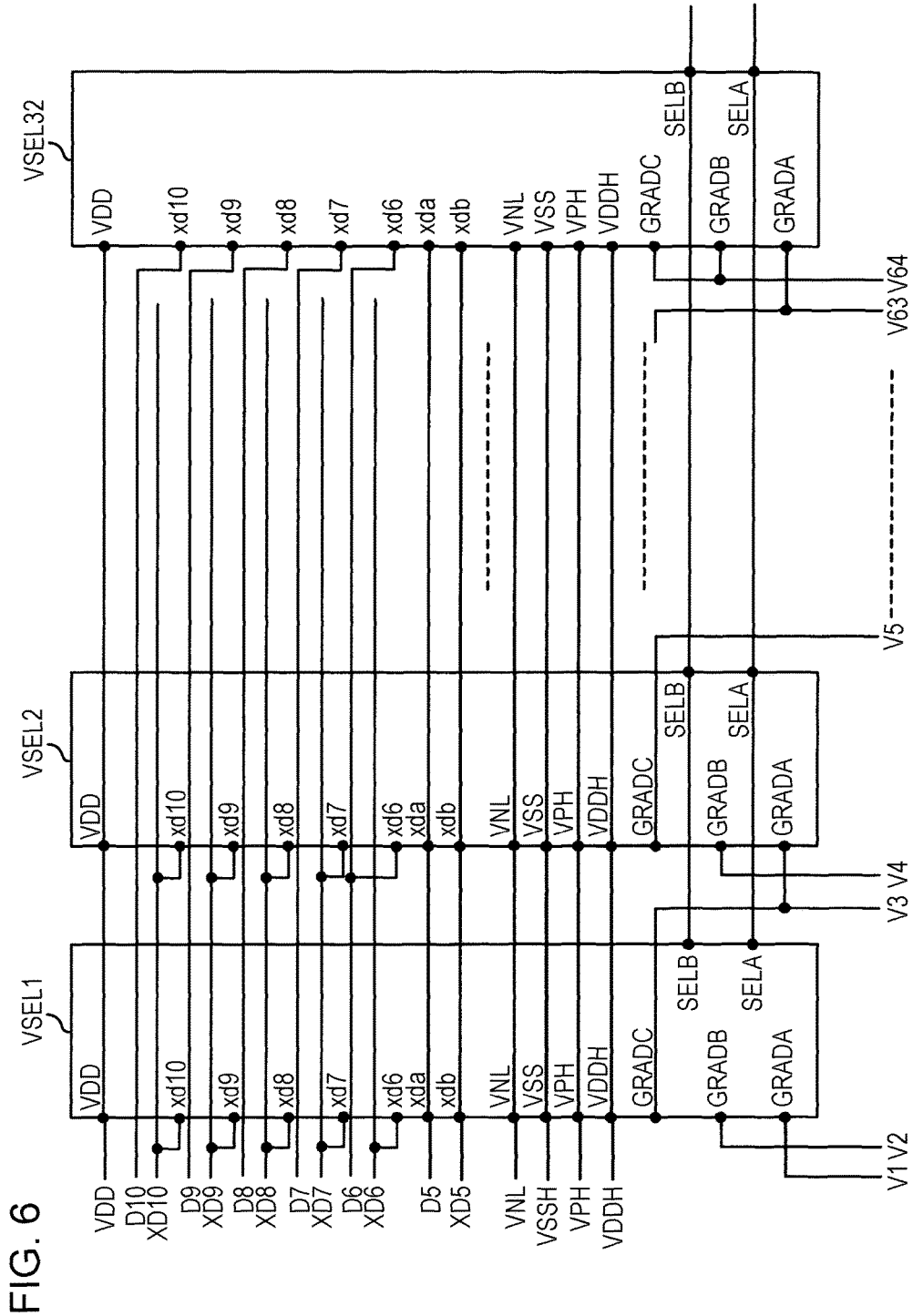
FIG. 6 is a diagram illustrating an example of the detailed configuration of a voltage selection circuit included in the driving circuit.

FIG. 6 illustrates an example of the detailed configuration of the voltage selection circuit DEC1 illustrated in FIG. 1. Here, in the following, a configuration in which j=6 and k=5 will be taken as an example and described. Further, in the following, the voltage selection circuit DEC1 will be taken as an example and described, and the configuration of each of the other voltage selection circuits DEC2 to DECN is the same as the configuration of the voltage selection circuit DEC1.

The voltage selection circuit DEC1 includes voltage selection sections VSEL1 to VSEL32 (VSEL1 to VSEL2$^{(j-1)}$). The voltage selection sections VSEL1 to VSEL32 has the same configuration.

Voltages VDD, VNL, VSSH, VPH, and VDDH, reference voltages V1 to V64, upper bits of data D5 to D10, and pieces of reverse data XD5 to XD10 are input to each of the voltage selection units VSEL1 to VSEL32. The pieces of reverse data XD5 to XD10 are data resulting from reversing the respective upper bits of data D5 to D10. Each of the pieces of reverse data (for example, the piece of reverse data XD5) is data that becomes H-level when a corresponding bit of data (the bit of data D5) is L-level and becomes L-level when the corresponding bit of data is H-level. The bit of data D5 and the piece of reverse data XD5 are respectively input as a piece of data xda and a piece of data xdb.

More specifically, voltages GRADA to GRADC described below are input to each of the voltage selection sections VSEL1 to VSEL32.

| Voltage Selection Section | Voltage (GRADA, GRADB, GRADC) |
|---|---|
| VSEL1 | (V1, V2, V3) |
| VSEL2 | (V3, V4, V5) |
| VSEL3 | (V5, V6, V7) |
| ... | ... |
| VSEL32 | (V63, V64, V64) |

Further, pieces of data xd6 to xd10 described below are input to each of the voltage selection sections VSEL1 to VSEL32.

| Voltage Selection Section | Data (xd6, xd7, xd8, xd9, xd10) |
|---|---|
| VSEL1 | (XD6, XD7, XD8, XD9, XD10) |
| VSEL2 | (D6, XD7, XD8, XD9, XD10) |
| VSEL3 | (XD6, D7, XD8, XD9, XD10) |
| ... | ... |
| VSEL32 | (D6, D7, D8, D9, D10) |

Each of the voltage selection sections VSEL1 to VSEL32 outputs the two reference voltages SELA and SELB from among the three kinds of reference voltages GRADA to GRADC on the basis of input pieces of data xd6 to xd10.

Figure 7:
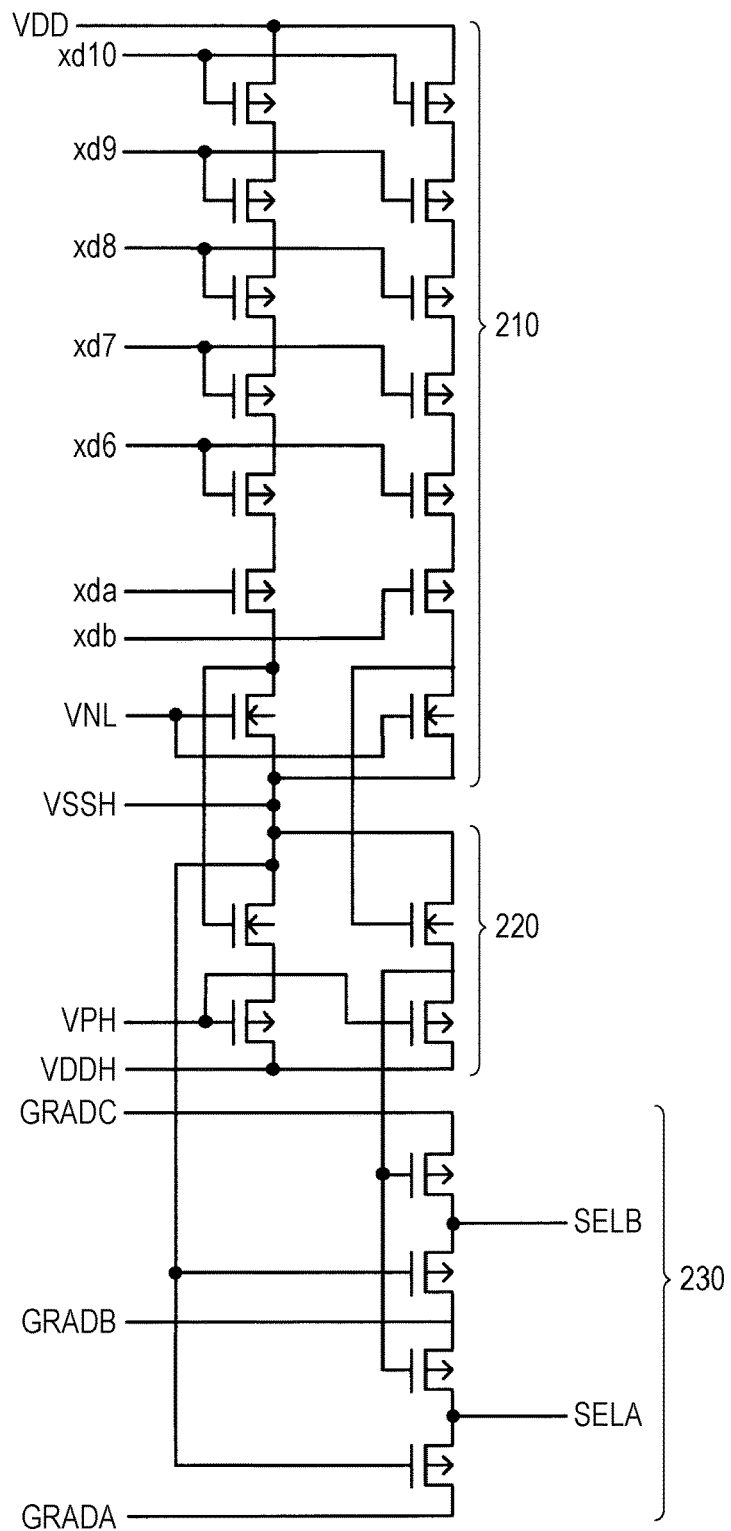
FIG. 7 is a diagram illustrating an example of the detailed configuration of a voltage selection section included in the voltage selection circuit.

An example of the detailed configuration of the voltage selection section described above. The voltage selection section shown in FIG. 7 includes a decoder 210, a level shifter 220, and a selector 230.

The decoder 210 includes two groups of decoder circuits each including serially coupled six P-type (first conductive type) metal oxide semiconductor (hereinafter referred to as MOS) transistors. A power supply voltage VDD is supplied to one end of each of the decoder circuits. Further, an N-type (second conductive type) MOS transistor is coupled to the other end of each of the decoder circuits. In one of the two groups of decoder circuits, the pieces of data xd10 to xd6 and xda are each supplied to the gate of a corresponding one of the p-type MOS transistors, and a voltage VNL is supplied to the N-type MOS transistor. In the other one of the two groups of decoder circuits, the pieces of data xd10 to xd6 and xdb are each supplied to the gate of a corresponding one of the p-type MOS transistors, and the voltage VNL is supplied to the N-type MOS transistor.

The voltage VNL is a voltage higher than a threshold value voltage of each of the N-type MOS transistors. In the one group of the two groups of decoders, when, in a state in which all of the pieces of data xd10 to xd6 and xda are L-levels, the voltage VNL allows a drain electric current to occur in the N-type MOS transistor, a constant electric current occurs between the source and the drain of each of the serially coupled P-type MOS transistors and, as a result, a H-level signal is output to the level shifter 220. Similarly, in the other one group of the two groups of decoders, when, in a state in which all of the pieces of data xd10 to xd6 and xdb are L-levels, the voltage VNL allows a drain electric current to occur in the N-type MOS transistor, a constant electric current occurs between the source and the drain of each of the serially coupled P-type MOS transistors, and as a result, a H-level signal is output to the level shifter 220.

The level shifter 220 is a double-element level shifter. Moreover, the level shifter 220 includes P-type MOS transistors whose gates are supplied with a voltage VPH. The voltage VPH is a voltage that is lower as compared with a power supply voltage VDD by at least a threshold value voltage of each of the P-type MOS transistors and that is set so as to enable a drain electric current, a constant electric current, to occur in each of the P-type MOS transistors. With this configuration, when one of two N-type MOS transistors constituting the level shifter 220 is turned on, a corresponding one of two outputs of the level shifter 220 is brought to H-level, and when the one of two N-type MOS transistors is turned off, the corresponding one of the two outputs of the level shifter 220 is brought to L-level.

The selector 230 outputs any one of a voltage combination (SELA, SELB)=(GRADA, GRADB) and anther voltage combination (SELA, SELB)=(GRADB, GRADC) on the basis of the two outputs of the level sifter 220.

4. Second Voltage Selection Circuit

Figure 8:
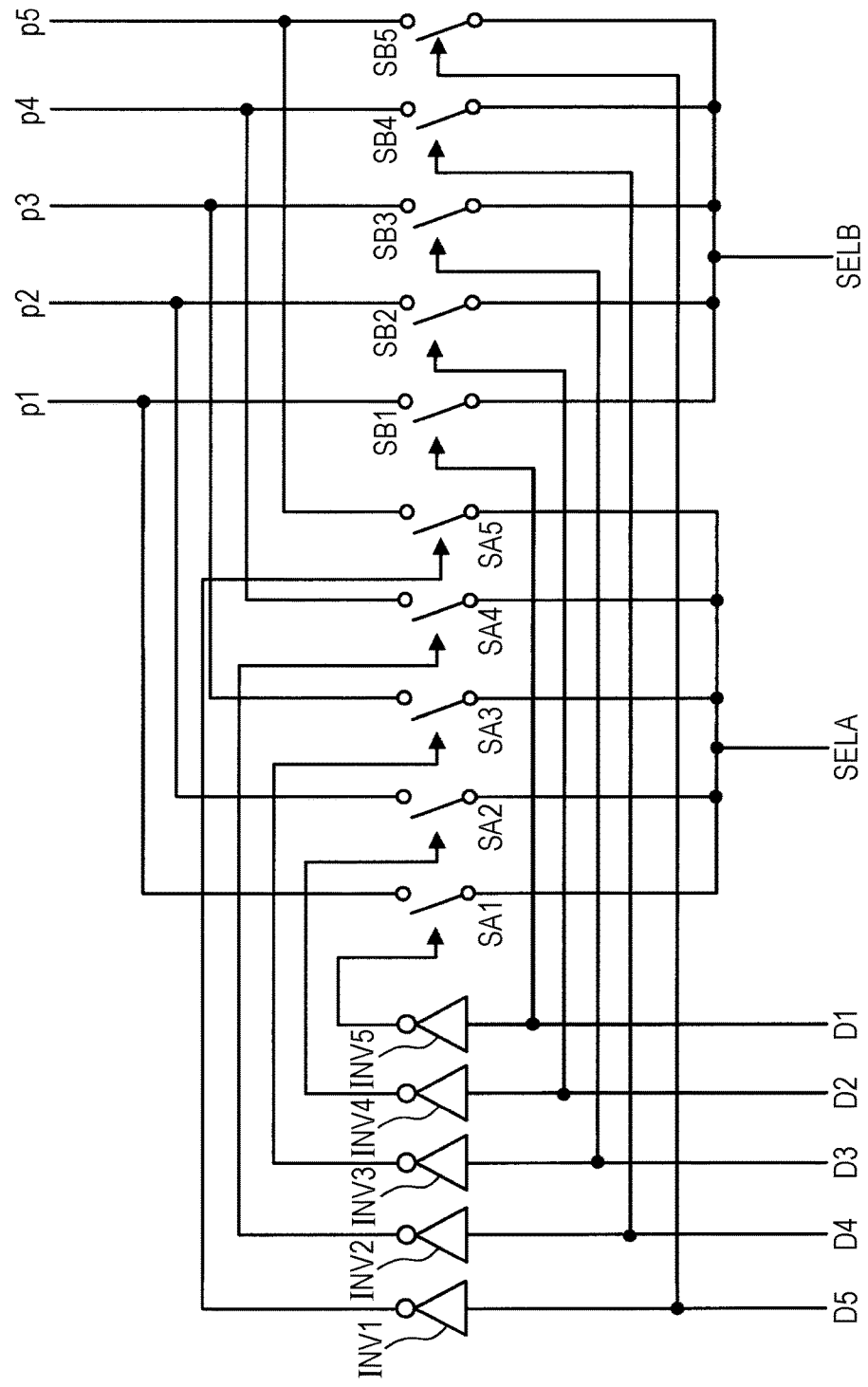
FIG. 8 is a diagram illustrating an example of the detailed configuration of a second voltage selection circuit included in the driving circuit.

FIG. 8 illustrates an example of the detailed configuration of the second voltage selection circuit OCB1 illustrated in FIG. 1. Here, in the following, a case in which k=5 will be taken as an example and described. Further, in the following, the second voltage selection circuit OCB1 will be taken as an example and described, and the configuration of each of the other second voltage selection circuits OCB2 to OCBN is the same as the configuration of the second voltage selection circuit OCB1.

The second voltage selection circuit OCB1 includes inverters INV1 to INV5, switch circuits SA1 to SA5, and switch circuits SB1 to SB5. The inverters INV1 to INV5 outputs pieces of reverse data resulting from inverting the lower bits of data D1 to D5 (D1 to Dk). The pieces of reverse data, resulting from inverting the lower bits of data D1 to D5, are input to the switch circuits SA1 to SA5, and the lower bits of data D1 to D5 are input to the switch circuits SB1 to SB5.

When the piece of data D1 is L-level, the switch circuit SA1 is turned on whereas the switch circuit SB1 is turned off, and as a result, the voltage SELA is output as the selection voltage p1. When the piece of data D1 is H-level, the switch circuit SA1 is turned off whereas the switch circuit SB1 is turned on, and as a result, the voltage SELB is output as the selection voltage p1. Similarly, ON/OFF of each of the switch circuits SA2 to SA5 and ON/OFF of a corresponding one of the switch circuits SB2 to SB5 are controlled in accordance with the logical level of a corresponding one of the pieces of data D2 to D5 to allow either the voltage SELA or the voltage SELB to be output as a corresponding one of the selection voltages p2 to p5.

With this configuration, 1st to 5th selectors (1st to k-th selectors in a broad sense) are each constituted by a corresponding one of the switch circuits SA1 to SA5 and a corresponding one of the switch circuits SB1 to SB5, and an i-th selection voltage pi (i being a natural number smaller than or equal to k) among the 1st to 5th selection voltages p1 to p5 (1st to k-th selection voltages in a broad sense) is selected from among the voltages SELA and SELB in accordance with the logical value of an i-th bit of data Di among the five (k) lower bits of data.

5. First Output Circuit

Figure 9:
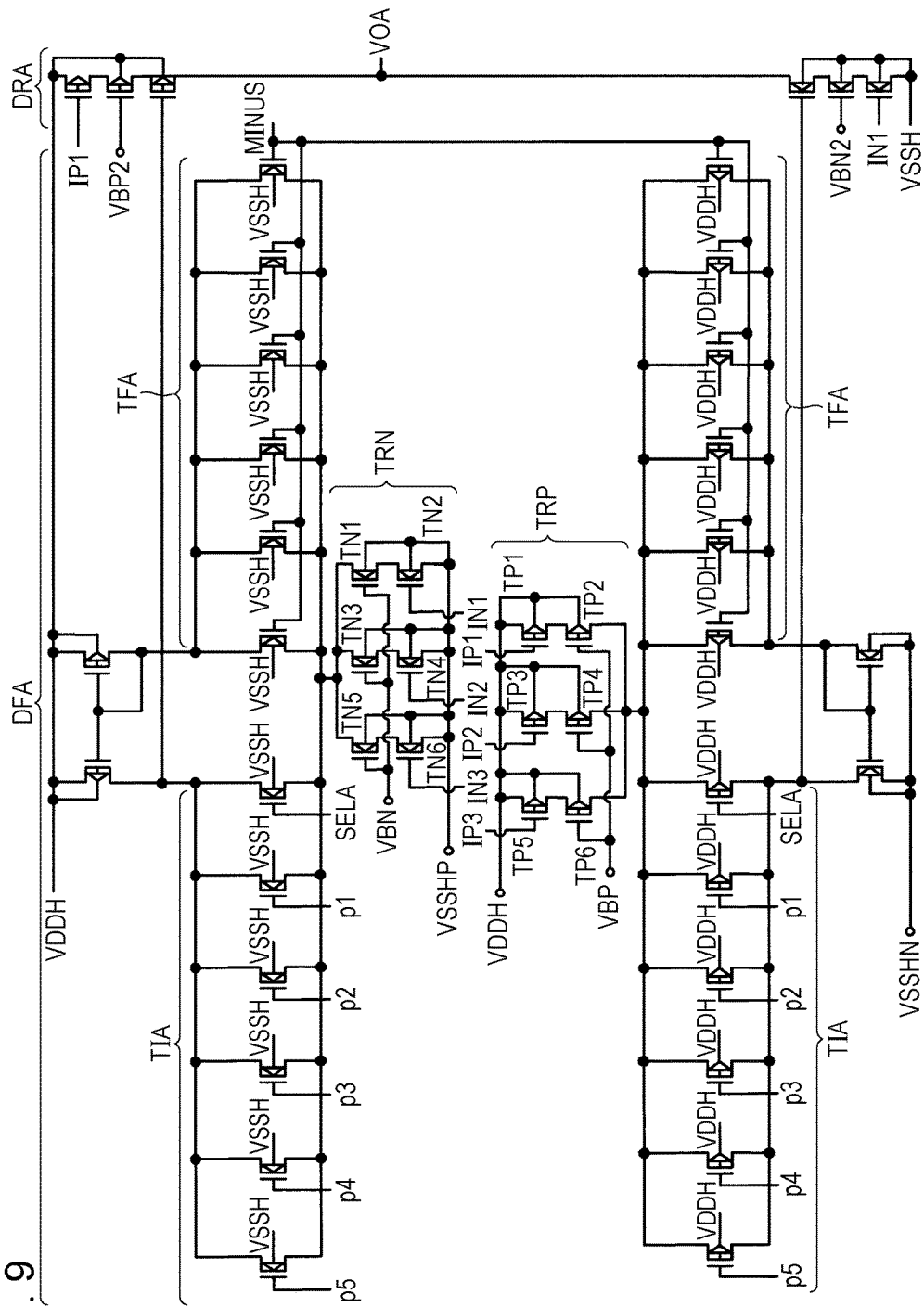
FIG. 9 is a diagram illustrating an example of the detailed configuration of the first output circuit.

FIG. 9 illustrates an example of the detailed configuration of the first output circuit AM1 illustrated in FIG. 2. Further, in the following, a case in which k=5 will be taken as an example and described.

The first output circuit shown in FIG. 9 is a voltage follower circuit including a differential section DFA (a differential amplifier section) and a driving section DRA. The differential section DFA includes a pair of differential transistor groups. The driving section DRA outputs an output voltage VOA to a data line on the basis of the outputs of the differential section DFA.

Specifically, an input side transistor group TIA and a feedback side transistor group TFA constitute each of the pair of differential transistor groups, and the input side transistor group TIA includes transistors having mutually different sizes whose ratio is, for example, 1:2:4:8:16. Similarly, the feedback side transistor group TFA includes transistors having mutually different sizes whose ratio is, for example, 1:2:4:8:16. The selected signals p1, p2, p3, p4, and p5 are input to the gates of the transistors whose size ratio is 1:2:4:8:16 in the input side transistor group. That is, the number of transistors to which a selected signal pi (i being a natural number smaller than or equal to five (k)) is input is weighted by $2^{(i-1)}$. Further, the voltage SELA is input to the gate of one transistor of the input side transistor group TIA. In the case where the transistor to which the voltage SELA is input does not exist, when all of the selected signals p1 to p5 are equal to the voltage SELA, the output voltage VOA is equal to the voltage SELA, and when all of the selected signals p1 to p5 are equal to the voltage SELB, the output voltage VOA is equal to the voltage SELB. In this case, 32 kinds of voltages including the voltage SELA and the voltage SELB are output, and as a result, a voltage from the voltage SELA up to the voltage SELB is divided by "31". In the case where the transistor to which the voltage SELA is input is provided, when all of the selected signals p1 to p5 are equal to the voltage SELA, the output voltage VOA is equal to the voltage SELA, and when all of the selected signals p1 to p5 are equal to the voltage SELB, the output voltage VOA is equal to a voltage calculated by a formula, VOA=SELB−(1/32)·(SELB−SELA). That is, even when all of the selected signals p1 to p5 are equal to the voltage SELB, the above configuration does not allow the output voltage VOA to be equal to the voltage SELB, and enables a voltage from the voltage SELA and the voltage SELB to be divided by "32".

Further, a reference electric-current supply section TRN and another reference electric-current supply section TRP respectively include transistors TN1 to TN6 and transistors TP1 to TP6. Each of the reference electric-current supply unit TRN and the reference electric-current supply unit TRP supplies a reference electric current to a corresponding one of the pair of differential transistor groups. That is, upon receipt of a reference voltage VBN, the transistors TN1 to TN6 supply a reference electric-current to one of the pairs of differential transistors, whereas, upon receipt of a reference voltage VBP, the transistors TP1 to TP6 supply a reference electric-current to the other one of the pairs of differential transistors. The ratio of the gate sizes of the transistors TN1, TN3, and TN5 is set to 1:4:5, and similarly, the ratio of the gate sizes of the transistors TN2, TN4, and TN6 is set to 1:4:5. Here, the gate size means W of W/L. That is, when control signals IN1, IN2, and IN3 are brought to L-level, the transistors TN2, TN4, and TN6 are turned off and the supply of the entire reference electric current is halted. As a result, the output of the first output circuit is brought into an OFF state. When the control signal IN1 is brought to H-level, the transistor TN2 is turned on, and 1/10 of the entire reference electric current is supplied. When the control signal IN2 is brought to H-level, the transistor TN4 is turned on, and 4/10 of the entire reference electric current is supplied. Further, when the control signal IN3 is brought to H-level, the transistor TN6 is turned on, and 5/10 of the entire reference electric current is supplied. In this way, ON/OFF of each of the control signals IN1 to IN3 is controlled to adjust the mount of the reference electric current to be supplied to a corresponding one of the pair of differential transistor groups. A similar relationship exists between control signals IP1 to IP3 and the transistors TP1 to TP6, which are P-channel side transistors.

In this way, weighting by $2^{(i-1)}$ (weighting proportional to $2^i$), that is, weighting whose amount increases as the position of a target bit of the lower bits of data D1 to D5 is shifted to the upper side, is applied to the number of transistors, and thus, an output voltage whose magnitude corresponds to the five lower bits of data D1 to D5 constituting the set of grayscale level data is output. Further, in this embodiment, the first output circuit is configured to enable the output of the first output circuit to be brought into an OFF state, or enable an output electric current to be adjusted.

6. Second Output Circuit

Figure 10:
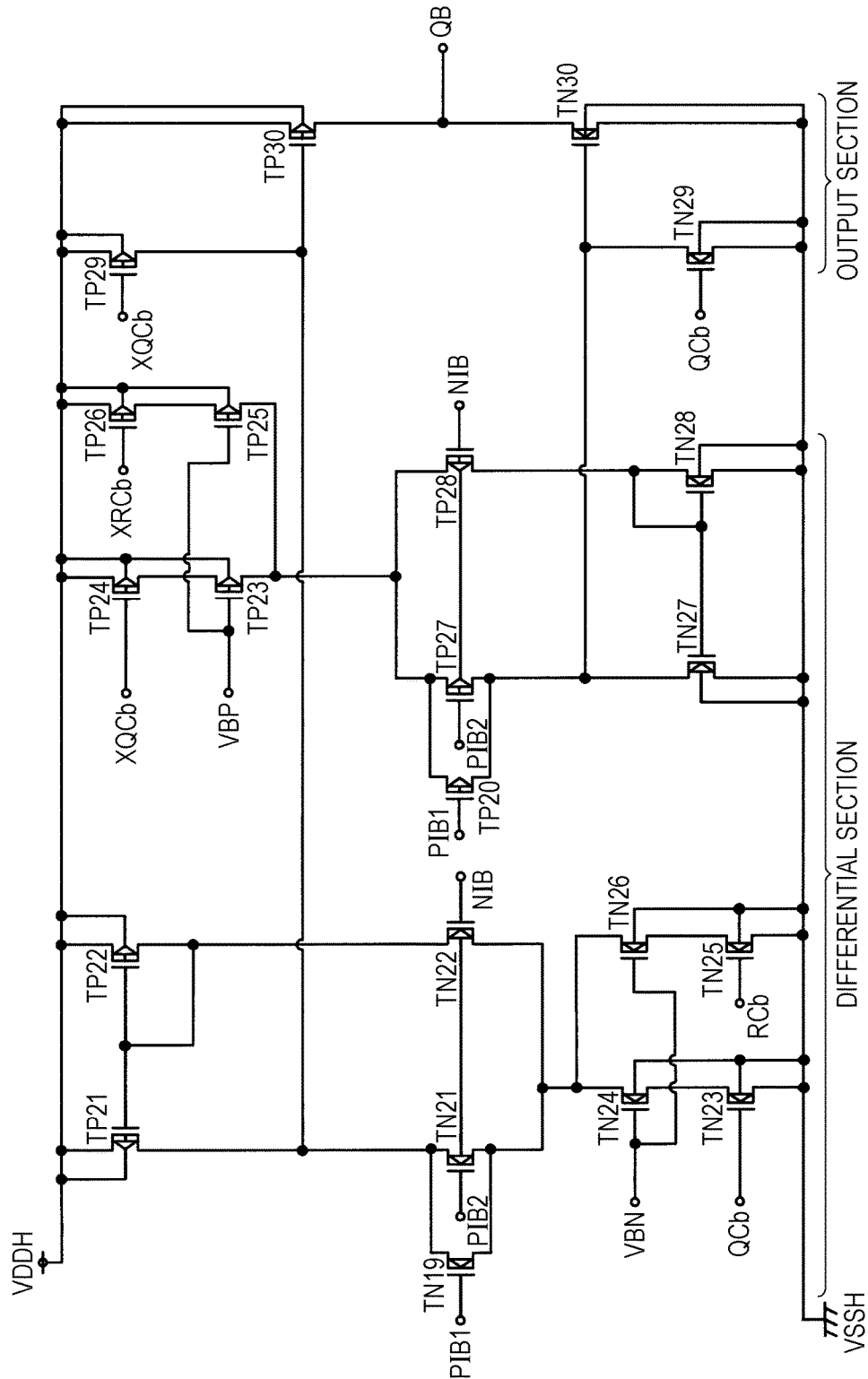
FIG. 10 is a diagram illustrating an example of the detailed configuration of the second output circuit.

FIG. 10 illustrates an example of the detailed configuration of the second output circuit AM2. The second output circuit AM2 includes a differential section constituted by a first differential section and a second differential section, and an output section.

The first differential section includes N-type CMOS transistors TN19, and TN21 to TN26, and P-type CMOS transistors TP21 and TP22. The transistors TN19, TN21, TN22, TP21, and TP22 constitute a differential pair, and upon receipt of a reference voltage VBN, the transistors TN24 and TN26 supply a reference electric current to the differential pair. The ratio of the gate size (W of W/L) of the transistor TN24 and the gate size of the transistor TN26 is set to 1:1. That is, when the control signals QCb and RCb are brought to L-level, the transistors TN23 and TN25 are turned off and the supply of the entire reference electric current is halted. As a result, the output of the second output circuit is brought into an OFF state. When the control signal QCb is brought to H-level, the transistor TN23 is turned on and 1/2 of the entire reference electric current is supplied.

The second differential section includes N-type CMOS transistors TN27 and TN28, and P-type CMOS transistors TP20, and TP23 to TP28. The transistors TN27, TN28, TP20, TP27, and TP28 constitute a differential pair, and upon receipt of a reference voltage VBP, the transistors TP23 and TP25 supply a reference electric current to the differential pair. The ratio of the gate size (W of W/L) of the transistor TP23 and that of the transistor TP25 is set to 1:1. Further, control signals XQCb and XRCb are signals resulting from reversing the logical levels of the control signals QCb and RCb. That is, when the control signals QCb and RCb are brought to L-level, the transistors TP24 and TP26 are turned off and the supply of the entire reference electric current is halted. As a result, the output of the second output circuit is brought into an OFF state. When the control signal XQCb is brought to H-level, the transistor TP24 is turned on and 1/2 of the entire electric-current is supplied.

In the case where the differential section is configured as, for example, a non-inverting amplifier, the selection voltage p5 is supplied to a non-inverting input node PIB1 of the differential section and the selection voltage p4 is supplied to a non-inverting input node PIB2 of the differential section. Further, the voltage of an output node QB is fed back to an inverting input node NIB via a resistor circuit or any other kind of circuit.

The output section includes N-type CMOS transistors TN29 and TN30, and P-type CMOS transistors TP29 and TP30. Upon receipt of the output of the first differential section, the transistor TP30 outputs an output voltage to the output node QB, and similarly, upon receipt of the output of the second differential section, the transistor TN30 outputs an output voltage to the output node QB. When the control signal QCb is brought to H-level, the transistors TP29 and TN29 are turned on whereas the transistors TP30 and TN30 are turned off, and the output node QB is set to a high impedance state.

Further, there is a difference in size (W/L) between the transistors for use in the differential pair and the output of the first output circuit AM1 and the transistors for use in the differential pair and the output of the second output circuit AM 2. That is, the sizes of the transistors for use in each of the first output circuit AM1 and the second output circuit AM2 are designed so as to satisfy the driving power and the voltage accuracy that are required in each of the first output circuit AM1 and the second output circuit AM2.

With the configuration in the above embodiment, the second output circuit AM2 outputs the lower bits of data D1 to D5 (lower k (=5) bits of data) as the second output voltage Q2, as shown in FIG. 3.

Further, the above configuration enables a voltage falling within a range from the reference voltage SELA up to the reference voltage SELB to be output as the second output voltage Q2, as shown in FIG. 3.

7. Distribution of Output Voltage of Output Circuit OUT

Figure 12:
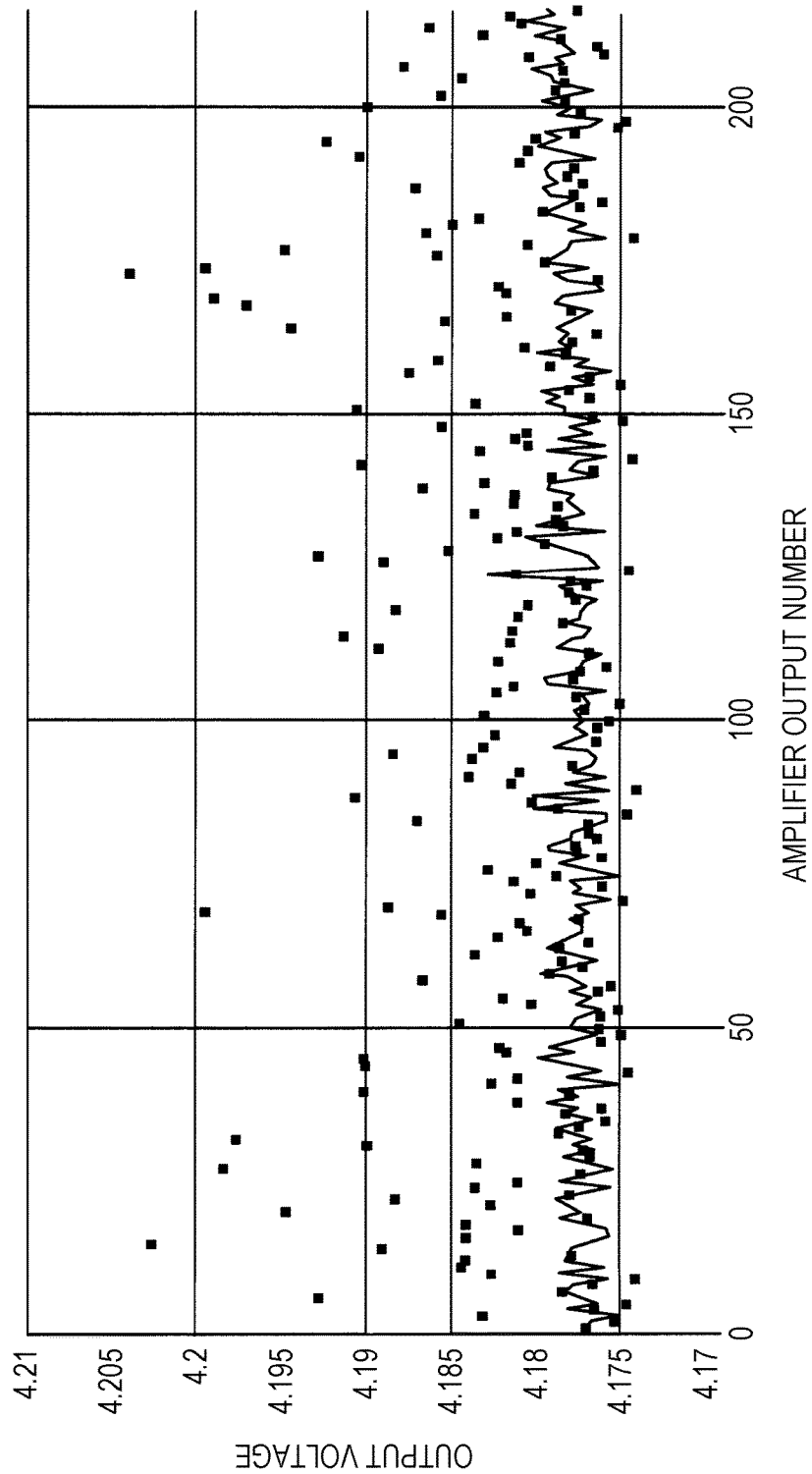
FIG. 12 is a diagram illustrating a distribution of the output voltage of an output circuit in the embodiment of the invention and a distribution of the output voltage of an output circuit in a comparison example.

FIG. 12 illustrates a distribution of the output voltage of the output circuit OUT in this embodiment and a distribution of the output voltage of an output circuit in a comparison example. As shown in FIG. 12, in the comparison example, the second output circuit AM2 sets the output voltage Q2 to a high impedance state in each of dead zones, and thereafter, the first output circuit AM1 outputs a target grayscale electric potential to a data line. When display driving using a plurality of such circuits is performed, the variation of output voltages occurs among the output circuits, as shown in FIG. 12, and this variation causes brightness differences among display units driven by the respective output circuits. As a result, this brightness differences degrade the display quality.

The first output circuit AM1, capable of outputting a voltage with high accuracy, is constituted by transistors each having a large area, that is, having a long transistor-length, to reduce the variation, whereas the second output circuit AM2, having a high driving capability, is constituted by transistors each having a short transistor-length because, for the second output circuit AM2, the increase of the operation speed is given more importance than the reduction of the variation. As a result, when the electric potential of the input and that of the output are close to each other, the second output circuit AM2, having a high driving capability, is designed so as to enter a dead zone to bring the output of the second output circuit AM2 into a high impedance state, but the width of this dead zone varies and this variation causes the variation of the output voltage shown in FIG. 12. Consequently, this variation of the output voltage adversely affects the display.

Thus, in this embodiment, before a timing point when the output of the second output circuit AM2 reaches a desired voltage value, the second output circuit AM2 is controlled so as to allow the output of the second output circuit AM2 to be brought into an OFF state. As a result of this control, as shown by a full line in FIG. 12, the variation of the output voltage is reduced.

8. Driving Method

Next, a driving method in this embodiment will be described in detail. In this embodiment, as shown in FIGS. 9 and 10, the first output circuit AM1 and the second output circuit AM2 are each configured to provide a switch circuit in its reference electric current supply section to enable ON/OFF control of the reference electric current to be performed.

Figure 11:
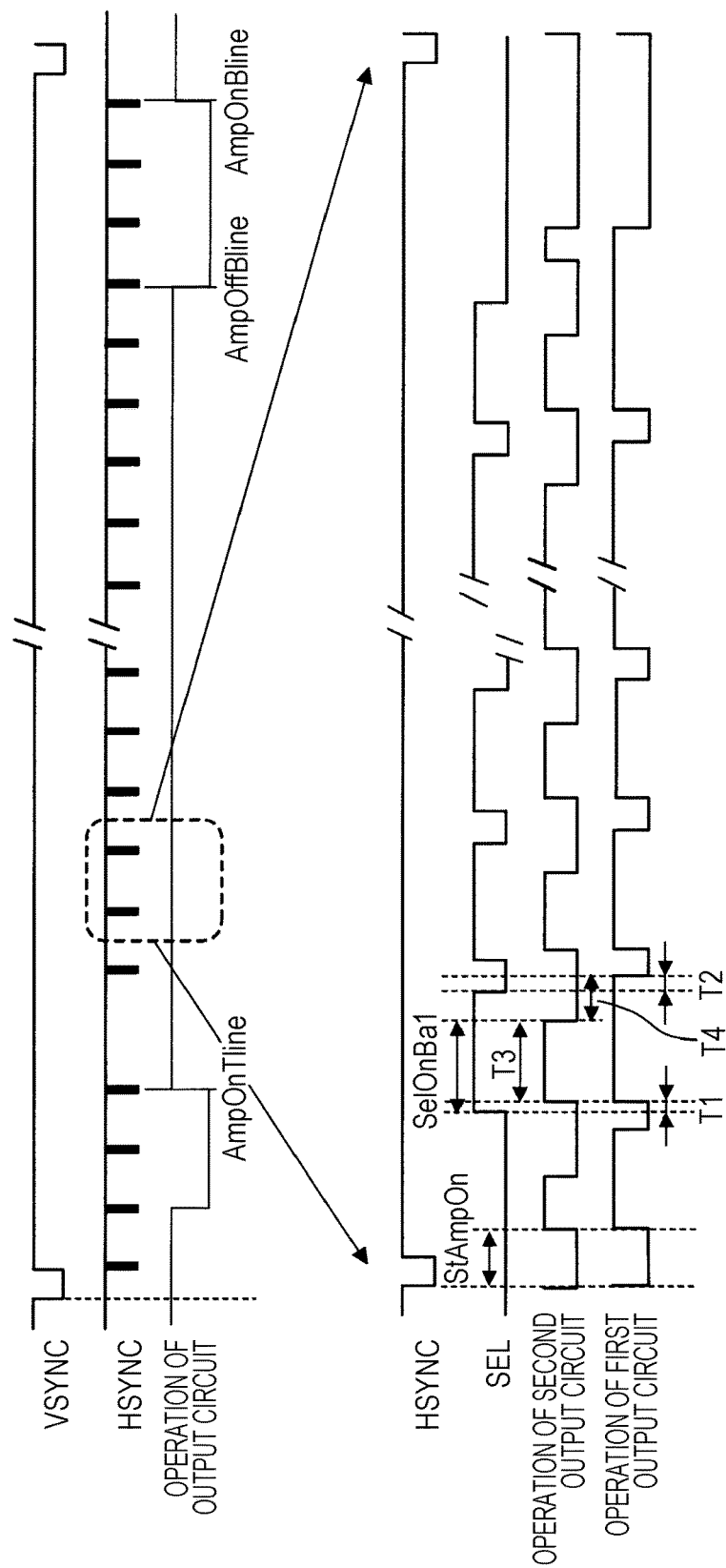
FIG. 11 is a timing chart illustrating an example of the operation of the driving circuit according to the embodiment of the invention.

In this embodiment, 18 multi-writing method is employed, and in this 18 multi-writing method, one output circuit OUT1 writes pieces of data corresponding to 18 lines during one horizontal period. In such a writing method, as shown in FIG. 11, after an elapse of a period T1 from rising of a SEL signal to H-level, the output of the second output circuit AM2 and the output of the first output circuit AM1 are each brought into an ON state. Accordingly, during a period (a first period T3) from a timing point at which the output of the first output circuit AM1 is brought into an ON state until a timing point before a timing point at which the output voltage of the second output circuit AM2 reaches a desired voltage value (for example, a voltage value of the lower end or the upper end of a dead zone), each of the second output circuit AM2 and the first output circuit AM1 outputs a voltage onto a data line.

Further, in this embodiment, at a timing point when the first period T3 has passed, the output of the second output circuit AM2 is brought into an OFF state, and during a second period T4 thereafter, only the first output circuit AM1 outputs a voltage onto the data line.

With this configuration, even when the variation exists among the dead zones of the second output circuit AM2, during the second period T4, the output of the second output circuit AM2 is brought into an OFF state to allow only the first output circuit AM1 to output a voltage, and thus, the output voltage of the output circuit OUT is not affected by the variation of the dead zones of the second output circuit AM2.

As a result, this configuration reduces the variation of the outputs of the output circuits OUT, as shown in the full line in FIG. 12, and reduces the brightness differences among the units of display driven by the respective output circuits OUT.

Further, in this embodiment, during a period when the SEL signal becomes non-active, the output of the second output circuit AM2 is also brought into an OFF state. This configuration reduces the power consumption. Moreover, during a constant period of time after the SEL signal has become non-active, the output of the first output circuit AM1 is brought into an OFF state. This configuration further reduces the power consumption.

9. Electro-Optic Device

Figure 13:
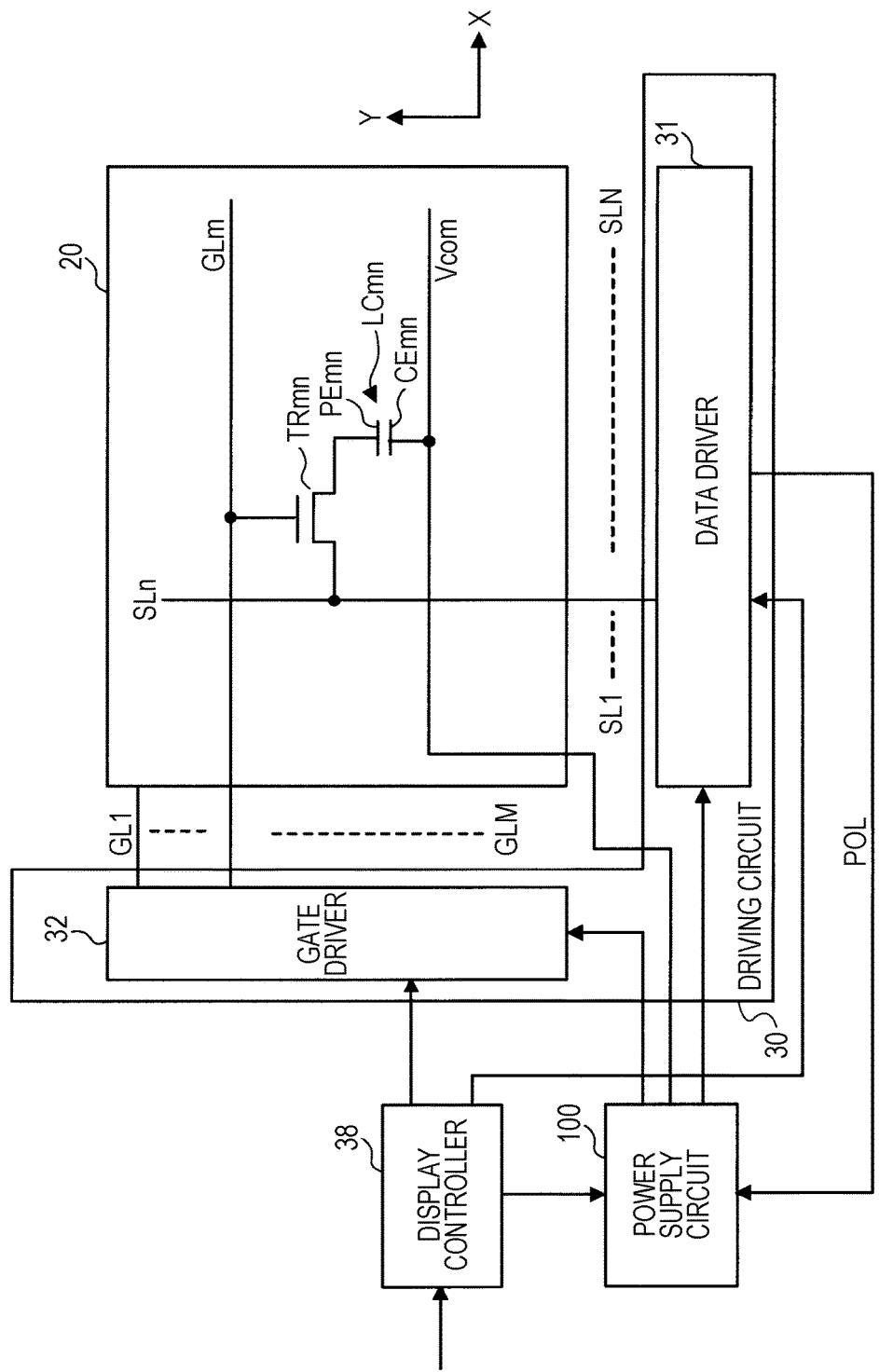
FIG. 13 is a diagram illustrating an example of the configuration of an electro-optic device to which the embodiment of the present invention is applied.

FIG. 13 illustrates an example of the configuration of an electro-optic device to which the driving circuit according to this embodiment is applied. The electro-optic device shown in FIG. 13 includes an electro-optic panel 20, a driving circuit 30, a display controller 38, and a power supply circuit 100.

Here, it should be noted that, in the following, a case in which the electro-optic device according to this embodiment is a liquid crystal display device will be taken as an example and described, but the electro-optic device according to this embodiment is not limited to the liquid crystal display device. In addition to the liquid crystal display device, for example, an electronic paper device, such as, an electronic paper device utilizing electrophoresis, and an electro-luminescence (EL) display device are assumed as the electro-optic device according to this embodiment.

An electro-optic panel 20 shown in FIG. 13 is constituted by a liquid crystal display (LCD) panel. The electro-optic panel 20 is formed on, for example, a glass substrate. A plurality of gate lines (scanning lines) GL1 to GLM (M being a natural number larger than or equal to "2") and a plurality of data lines (source lines) SL1 to SLN (N being a natural number larger than or equal to "2") are disposed on the glass substrate. The plurality of gate lines GL1 to GLM are arranged in a Y direction, and each of the gate lines GL1 to GLM extends in an X direction, whereas the plurality of data lines SL1 to SLN are arranged in the X direction, and each of the data lines SL1 to SLN extends in the Y direction. The Y direction is a direction perpendicular to the X direction. Further, a pixel region (a pixel) is disposed so as to correspond to a position at which a gate line GLm (m being a natural number smaller than or equal to M) and a data line SLn (n being a natural number smaller than or equal to N) intersect with each other, and a transistor TRmn is disposed in the pixel region.

The gate of the transistor TRmn is coupled to the gate line GLm. The source of the transistor TRmn is coupled to the data line SLn. The drain of the transistor TRmn is coupled to a pixel electrode PEmn. Liquid crystal is injected and sealed between the pixel electrode PEmn and a facing electrode CEmn facing the pixel electrode PEmn, and liquid crystal capacitance (a liquid crystal element in a broad sense) LCmn, which element capacitance, is formed. The transmittance of a pixel is configured to vary in accordance with an applied voltage between the pixel electrode PEmn and the facing electrode CEmn. The facing electrode CEmn is supplied with a facing electrode voltage Vcom.

The driving circuit 30 drives the gate lines GL1 to GLM and the data lines SL1 to SLN. Specifically, the driving circuit 30 includes a data driver 31 and a gate driver 32.

The data driver 31 drives each of the data lines SL1 to SLN of the electro-optic panel 20 on the basis of (j+k) bits of grayscale level data (j and k being natural numbers). The gate driver 32 scans the gate lines GL1 to GLM of the electro-optic panel 20 during each vertical scanning period.

The power supply circuit 100 generates voltages needed to drive the data lines SL1 to SLN, and supplies the generated voltages to the data driver 31. The power supply circuit 100 generates power supply voltages needed to drive the data lines SL1 to SLN of the data driver 31, such as voltages VDDH and VSSH, and voltages for a logic section of the data driver 31. Further, the power supply circuit 100 generates voltages needed to scan the gate lines GL1 to GLM, and supplies the generated voltages to the gate driver 32. Further, the power supply circuit 100 generates the facing electrode voltage Vcom.

The display controller 38 controls the data driver 31, the gate driver 32, and the power supply circuit 100 in accordance with setting contents set by a host apparatus (not illustrated), such as a central processing unit (CPU) device. For example, the display controller 38 sets operation modes of the data driver 31 and the gate driver 32, and internally generates various signals to be supplied to the data driver 31 and the gate driver 32, such as a vertical synchronization signal and a horizontal synchronization signal. Further, the display controller 38 (or the host apparatus) supplies a set of grayscale level data to the data driver 31.

Figure 14:
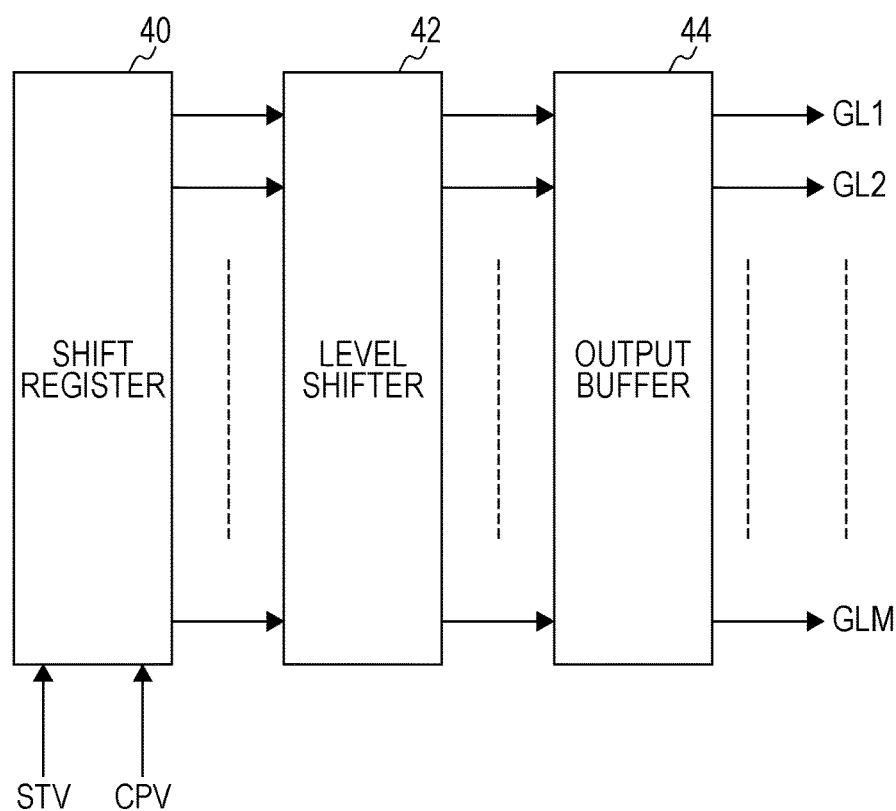
FIG. 14 is a diagram illustrating an example of the detailed configuration of a gate driver included in the electro-optic device.

FIG. 14 illustrates an example of the detailed configuration of the gate driver 32 illustrated in FIG. 13. The gate driver 32 includes a shift register 40, a level shifter 42, and an output buffer 44.

The shift register 40 includes a plurality of serially coupled flip-flops each provided so as to be associated with a corresponding one of the gate lines. When a start pulse signal STV (the vertical synchronization signal) is retained onto a first stage flip-flop among the flip-flops in synchronization with a clock signal CPV (the horizontal synchronization signal), the shift register 40 sequentially shifts the start pulse signal STV to an adjacent flip-flop among the flip-flops in synchronization with the clock signal CPV. The level shifter 42 shifts the levels of the voltages from the shift register 40 to the levels within a range of an operation voltage of the electro-optical panel 20. The output buffer 44 performs buffering of scanning voltages resulting from the level shifting by the level shifter 42, and outputs the buffered scanning voltages to the gate lines to drive the gate lines.

Figure 15:
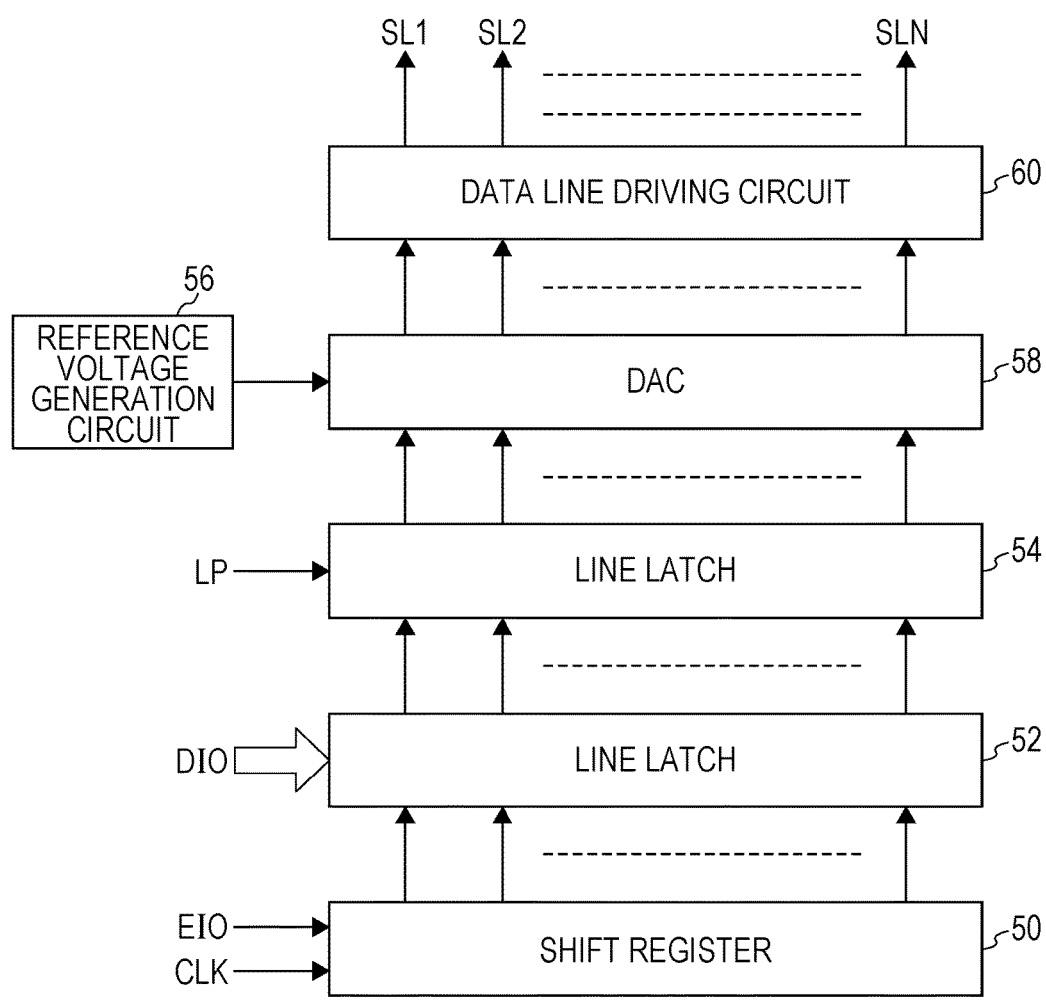
FIG. 15 is a diagram illustrating an example of the detailed configuration of a data driver included in the electro-optic device.

FIG. 15 illustrates an example of the detailed configuration of the data driver 31 illustrated in FIG. 13. The data driver 31 includes a shift register 50, line latches 52 and 54, a reference voltage generation circuit 56 (a grayscale voltage generation circuit in a narrow sense), a digital-to-analog converter (DAC) 58, and a data line driving circuit 60.

The shift register 50 includes a plurality of serially coupled flip-flops each provided so as to be associated with a corresponding one of the data lines. Further, the shift register 50 sequentially sifts an enable input/output signal EIO to an adjacent flip-flop among the flip-flops in synchronizations with a clock signal CLK. Pieces of image data DIO (grayscale level data) are input to the line latch 52. The line latch 52 latches the pieces of image data DIO in synchronization with the enable input/output signal EIO. The line latch 54 latches the pieces of image data, having been latched by the line latch 52, in synchronization with a horizontal synchronization signal LP to output, for each of the data lines, a set of image data corresponding to each horizontal scanning period. The clock signal CLK, the enable input/output signal EIO, the pieces of image data DIO, and the horizontal synchronization signal LP are input from, for example, the display controller 38.

The DAC 58 generates, for each of the data lines, analog grayscale voltages to be supplied to the each of the data lines, on the basis of the set of image data, composed of pieces of digital image data. Specifically, the DAC 58 selects, for each of the data lines, reference voltages corresponding to the set of image data, which is transferred from the line latch 54 and corresponds to each horizontal scanning period, from among a plurality of reference voltages (a plurality of grayscale voltages) from the reference voltage generation circuit 56. The data line driving circuit 60 performs buffering (impedance conversion in a broad sense) of the grayscale voltages from the DAC 58, and outputs the buffered voltages to the respective data lines SL1 to SLN.

Here, it should be noted that, in the data driver 31 shown in FIG. 5, the line latch 54 corresponds to the data latches DLAT1 to DLATN shown in FIG. 1; the reference voltage generation circuit 56 corresponds to the reference voltage generation circuit 56 shown in FIG. 1; the DAC 58 corresponds to the voltage selection circuits DEC1 to DECN shown in FIG. 1 and the second voltage selection circuits OCB1 to OCBN shown in FIG. 1; and the data line driving circuit 60 corresponds to the output circuits OUT1 to OUTN shown in FIG. 1.

Here, in this embodiment, a multiplex driving method that allows a single output circuit to drive a plurality of data lines on a time division basis, or a polarity inversion driving method that allows the polarity of the pixel electrode and that of the facing electrode to be inverted at intervals of a predetermined period may be carried out. When the multiplex driving method is carried out, for example, a multiplexer circuit is simply required to be inserted between the line latch 54 and the DAC 58.

10. Electronics Device

Figure 16:
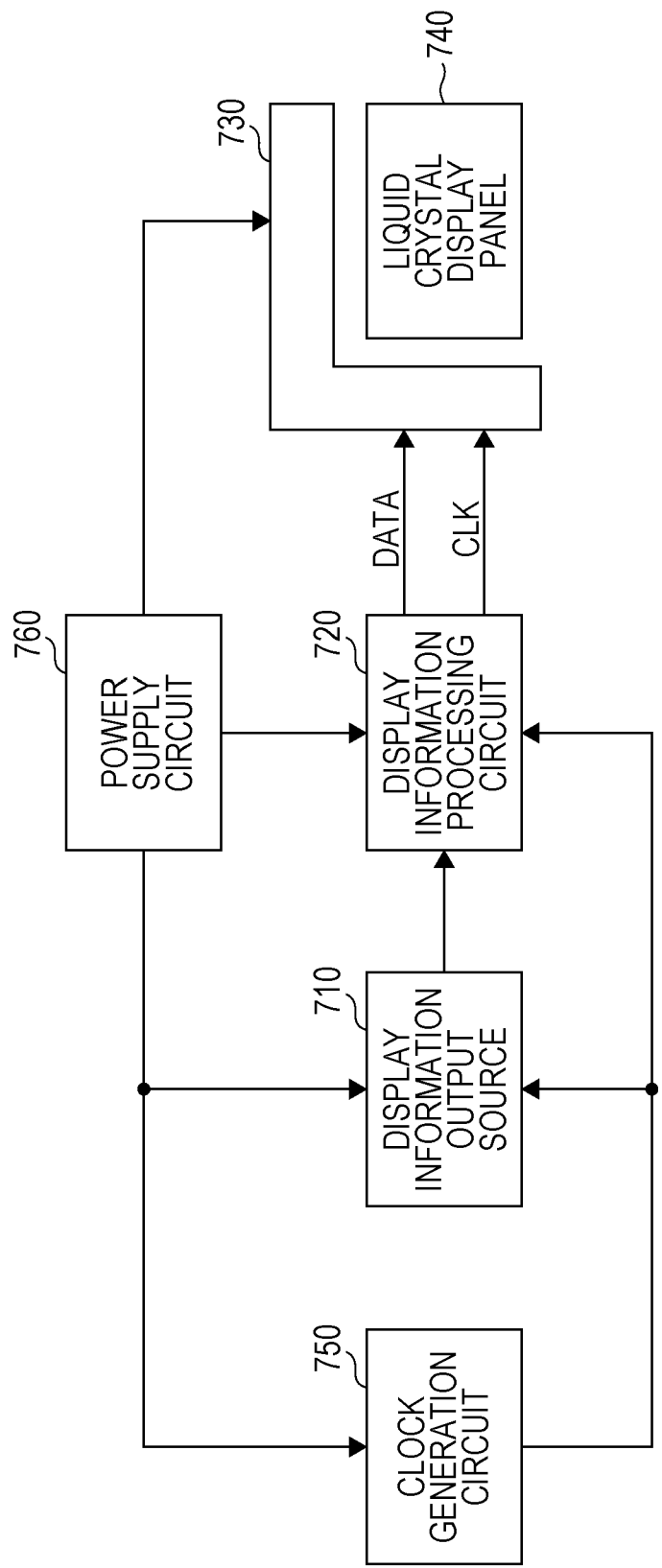
FIG. 16 is a diagram illustrating an example of the configuration of a projector, an example of an electronics device to which the electro-optic device is applied.

FIG. 16 illustrates an example of the configuration of a projector as an example of the configuration of an electronics device to which the electro-optic device according to this embodiment is applied. Here, it should be noted that, in addition to the projector, for example, a television receiving set, a car navigator, a mobile telephone terminal, a mobile information terminal, and a personal computer are each assumed as an electronics device to which the electro-optic device according to this embodiment is applied.

The projector includes a display information output source 710, a display information processing circuit 720, a driver 730 (a driving circuit), a liquid crystal display panel 740 (an electro-optic panel in a broad sense), a clock generation circuit 750, and a power supply circuit 760.

The display information output source 710 includes memory devices, such as a read only memory (ROM) module, a random access memory (RAM) module, and an optical disk device, a synchronization circuit that outputs image signals so as to allow the image signals to be output in synchronization with one another, and any other circuit, and outputs pieces of display information, such as an image signal having a predetermined format, to the display information processing circuit 720. The display information processing circuit 720 may include an amplification/polarity inversion circuit, a phase expansion circuit, a rotation circuit, a gamma correction circuit, a clamp circuit, and any other circuit. The driver 730 includes a gate driver (a scanning driver) and a data driver (a source driver), and drives the liquid crystal display panel 740. The power supply circuit 760 supplies electric power to each of the aforementioned circuits.

Heretofore, the embodiment according to the invention has been described in detail, and through this detailed description, it will be easily understood by those skilled in the art that a large number of modifications that do not substantively depart from the new matters and the advantageous effects of the invention can be made on the above-described embodiment. Naturally, all of such modifications are included in the scope of the invention. For example, the term stated at least once along with a different term in a broader sense or the same meaning in the specification or the figures can be replaced with the different term in anyplace of the specification or the figures. Further, the configurations and the operations of the driving circuit, the electro-optic device, the electronics device, and the like are also not limited to those having been described in this embodiment and various modifications can be made thereon.

11. Modification Example

In this embodiment, the length of the period T1 from a timing point at which the SEL signal rises to H-level until a timing point at which the output of the second output circuit AM2 is brought into an ON state may be appropriately changed in accordance with a display state and/or any other state of the electro-optic device.

Further, as shown in FIG. 11, the length of the period T2 from a timing point at which the SEL signal falls to L-level until a timing point at which the output of the first output circuit AM1 is brought into an OFF state may be appropriately changed in accordance with a display state and/or any other state of the electro-optic device.

In this embodiment, since the output of the second output circuit AM2 is brought into an OFF state after an elapse of the first period T3 and the output of the first output circuit AM1 is brought into an OFF state after an elapse of the period T2, the power consumption is reduced. In this regard, however, these outputs may not be entirely brought into the OFF state, but the reference electric current supply section shown in each of FIGS. 9 and 10 may be allowed to be served as an electric current reduction section to reduce the output electric current.

12. Application Example

Next, an electronics device to which an electro-optic device 1 according to an application example of the invention is applied will be described. The electro-optic device 1 is suitable for use in a high-definition display constituted of small size pixels. Thus, a head-mounted display will be taken as an example of the electronics device and described.

Figure 17:
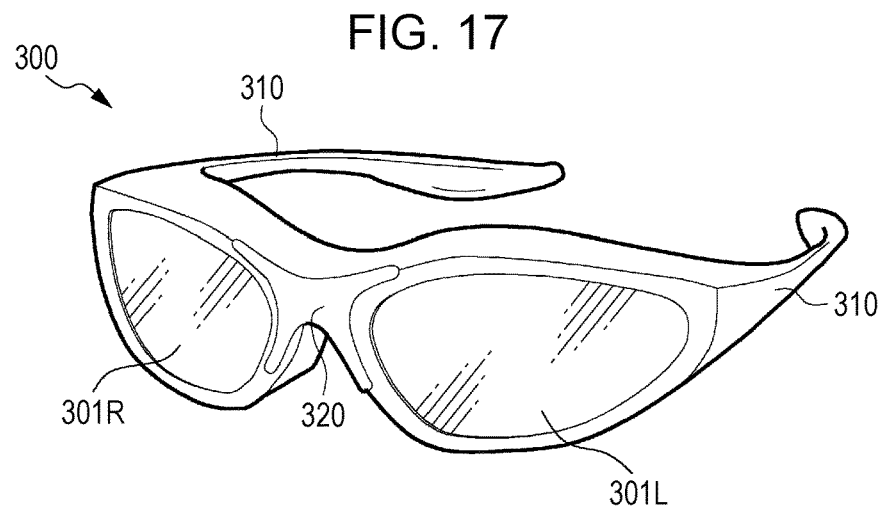
FIG. 17 is a diagram illustrating the external view of a head-mounted display, an example of an electronics device to which the electro-optic device is applied.
Figure 18:
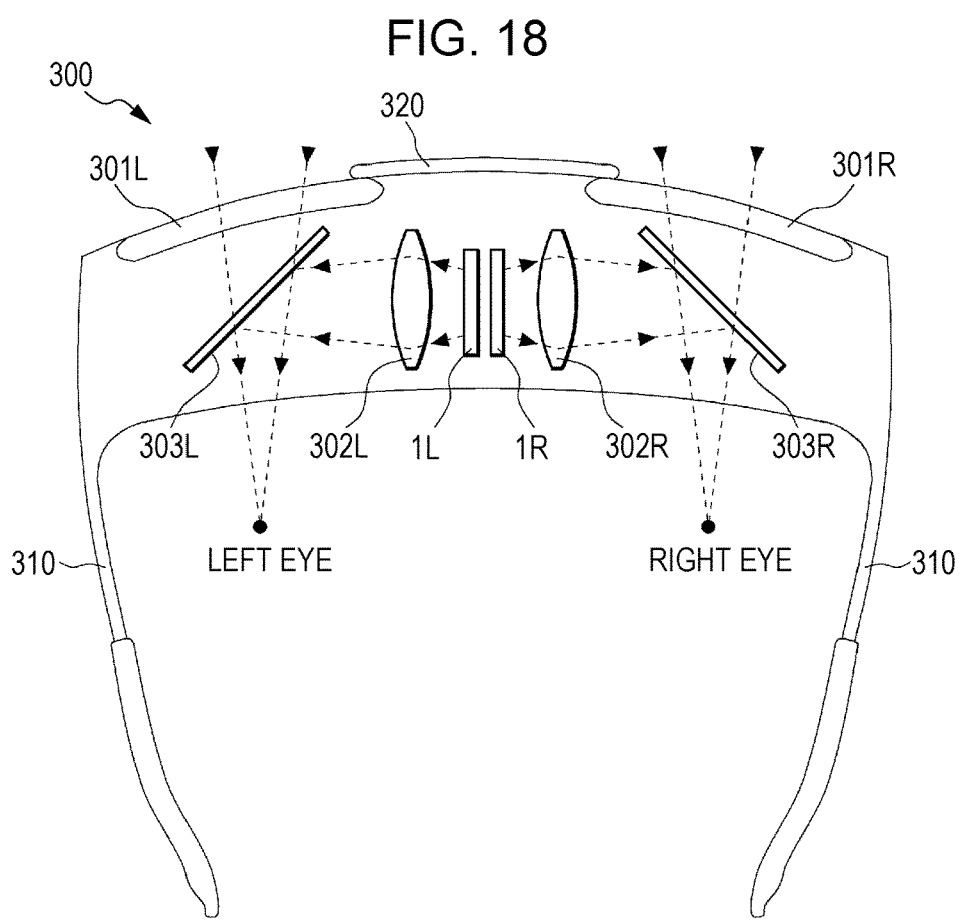
FIG. 18 is a diagram illustrating an example of the configuration of the head-mounted display.

FIG. 17 is a diagram illustrating the external view of a head-mounted display, and FIG. 18 is a diagram illustrating an optical configuration of the head-mounted display.

First, as shown in FIG. 17, the head-mounted display 300 includes a temple 310, a bridge 320, lenses 301L and 301R in appearance just like a common pair of glasses. Further, as shown in FIG. 18, the head-mounted display 300 includes an electro-optic device 1L for a left eye and an electro-optic device 1R for a right eye in portions adjacent to the bridge 320 and at the back sides of the lenses 301L and 301R (at the lower sides of the lenses 301L and 301R in FIG. 18).

The image display face of the electro-optic device 1L is disposed so as to be located at the left side in FIG. 18. This configuration allows an image displayed by the electro-optic device 1L to be output in a nine o'clock direction in FIG. 18 through the optical lens 302L. A half mirror 303L allows the image displayed by the electro-optic device 1L to be reflected in a six o'clock direction, whereas the half mirror 303L allows light input from a twelve o'clock direction to be transmitted through the i half mirror 303L itself.

The image display face of the electro-optic device 1R is disposed so as to be located at the right side, opposite the electro-optic device 1L. This configuration allows an image displayed by the electro-optic device 1R to be output in a three o'clock direction in FIG. 18 through the optical lens 302L. A half mirror 303R allows the image displayed by the electro-optic device 1R to be reflected in a six o'clock direction, whereas the half mirror 303R allows light input from the twelve o'clock direction to be transmitted through the half mirror 303R itself.

This configuration enables a user wearing the head-mounted display 300 to observe the images displayed by the respective electro-optic devices 1L and 1R in a see-through state in which the images overlap with an external scene.

Further, when, in the head-mounted display 300, an image for a left eye and an image for a right eye, these images having parallax therebetween, are respectively displayed on the electro-optic device 1L and the electro-optic device 1R, the displayed images enable the user to visually perceive an image having a depth and a three-dimensional appearance (three-dimensional display).

Further, the electro-optic device 1 is capable of being applied to, in addition to the head-mounted display 300, an electronic view finder in a video camera, an exchangeable-lens camera, and any other electronics device.

The entire disclosure of Japanese Patent Application No. 2015-244309, filed Dec. 15, 2015 is expressly incorporated by reference herein.

What is claimed is:

1. An electro-optic device comprising:
    a voltage selection circuit configured to select a higher electric potential side voltage and a lower electric potential side voltage that correspond to upper bits of data constituting a set of grayscale level data from among a plurality of reference voltages;
    a first output circuit configured to output a first output voltage corresponding to lower bits of data constituting the set of grayscale level data to a data line based on the higher electric potential side voltage and the lower electric potential side voltage;
    a second output circuit having a driving capability higher than a driving capability of the first output circuit and configured to output a second output voltage corresponding to upper bits of data among the lower bits of data constituting the set of grayscale level data to the data line on the basis of the higher electric potential side voltage and the lower electric potential side voltage; and
    a control circuit configured to allow the first output circuit and the second output circuit to be driven during a first period, and configured to bring an output of the second output circuit into an OFF state and allow the first output circuit to be driven during a second period subsequent to the first period.

2. The electro-optic device according to claim 1,
    wherein the second output circuit includes a differential pair and an electric current reduction section, and
    wherein the control circuit allows the electric current reduction section to reduce an electric current flowing through the differential pair during the second period.

3. An electronics device comprising the electro-optic device according to claim 2.

4. The electro-optic device according to claim 1, wherein the control circuit halts the second output circuit during an interval period after an elapse of the second period until a next start of the first period.

5. The electro-optic device according to claim 4, wherein the control circuit halts the first output circuit during the interval period, after an elapse of the second period until a next start of the first period, in addition to the second output circuit.

6. An electronics device comprising the electro-optic device according to claim 5.

7. An electronics device comprising the electro-optic device according to claim 4.

8. An electronics device comprising the electro-optic device according to claim 1.

9. A method for driving an electro-optic device, the method comprising:
    selecting a higher electric potential side voltage and a lower electric potential side voltage that correspond to upper bits of data constituting a set of grayscale level data from among a plurality of reference voltages;
    outputting a first output voltage corresponding to lower bits of data constituting the set of grayscale level data to a data line based on the higher electric potential side voltage and the lower electric potential side voltage;
    outputting a second output voltage corresponding to upper bits of data among the lower bits of data, constituting the set of grayscale level data, to the data line on the basis of the higher electric potential side voltage and the lower electric potential side voltage; and
    allowing the first output voltage and the second output voltage to be driven during a first period, and bringing an output of the second output circuit into an OFF state whereas allowing the first output voltage to be output during a second period subsequent to the first period.

* * * * *